US008436356B2

United States Patent
Lee et al.

(10) Patent No.: US 8,436,356 B2
(45) Date of Patent: May 7, 2013

(54) THIN FILM TRANSISTOR SUBSTRATE, METHOD OF FABRICATING THE SAME AND FLAT DISPLAY HAVING THE SAME

(75) Inventors: Shin-Bok Lee, Daejeon (KR); Seung-Hee Nam, Gyeonggi-do (KR); Nam-Seok Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 50 days.

(21) Appl. No.: 12/967,546

(22) Filed: Dec. 14, 2010

(65) Prior Publication Data
US 2011/0303917 A1   Dec. 15, 2011

(30) Foreign Application Priority Data
Jun. 11, 2010  (KR) .................. 10-2010-0055514

(51) Int. Cl.
*H01L 33/16*  (2010.01)
(52) U.S. Cl.
USPC .............. 257/59; 257/E29.295; 438/149
(58) Field of Classification Search ........... 257/59, 257/E29.29, E29, 295; 438/149
See application file for complete search history.

(56) References Cited

U.S. PATENT DOCUMENTS

| 6,660,553 | B2 * | 12/2003 | Kimura et al. .............. 438/48 |
| 7,202,179 | B2 | 4/2007 | Taussig et al. |
| 7,512,313 | B2 | 3/2009 | Dunton |
| 2006/0160278 | A1 * | 7/2006 | Mei .............................. 438/149 |
| 2007/0218594 | A1 | 9/2007 | Noda |
| 2007/0264759 | A1 | 11/2007 | Kamakura |
| 2008/0087893 | A1 | 4/2008 | Wang et al. |
| 2009/0072228 | A1 | 3/2009 | Choi et al. |

FOREIGN PATENT DOCUMENTS

| EP | 1643300 A1 | 4/2006 |
| JP | 04-170519 | 6/1992 |
| JP | 06-082832 | 3/1994 |
| JP | 10-031228 | 2/1998 |
| JP | 2008-098606 A | 4/2008 |

OTHER PUBLICATIONS

Japan Patent Office (JPO)—Japanese Patent Application No. 2010-276918—Office Action dated Sep. 25, 2012.

* cited by examiner

*Primary Examiner* — Matthew Landau
*Assistant Examiner* — Edward Chin
(74) *Attorney, Agent, or Firm* — Morgan, Lewis & Bockius LLP

(57) ABSTRACT

A thin film transistor substrate and a method for fabricating the same are disclosed. A thin film transistor substrate includes a substrate comprising a plurality of grooves having different depths, respectively, to have a multi-step structure; gate and data lines alternatively crossed in the grooves to form a plurality of pixel areas; thin film transistors formed in the grooves of the substrate to be formed in cross portion of the gate and data lines, wherein active layers of the thin transistors are formed along the gate lines and gate electrodes, the active layers separated from active layers of neighboring pixel areas with the data line located there between.

12 Claims, 42 Drawing Sheets

THIN FILM TRANSISTOR SUBSTRATE, METHOD OF FABRICATING THE SAME AND FLAT DISPLAY HAVING THE SAME

CROSS REFERENCE TO RELATED APPLICATION

This application claims the benefit of the Patent Korean Application No. 10-2010-0055514, filed on Jun. 11, 2010, which is hereby incorporated by reference as if fully set forth herein.

BACKGROUND OF THE DISCLOSURE

1. Field of the Disclosure

The present invention relates to a thin film transistor substrate having a self-alignment function to reduce production cost accordingly and a method of fabricating the thin film transistor, and a flat display having the thin film transistor substrate.

2. Discussion of the Related Art

In recent, a display device market has been changing rapidly, focused on flat display devices efficient to apply an enlarge size and a compact size to. Such a flat display device may be classified into a liquid crystal display (LCD), a plasma display panel (PDP), an organic electro luminescence display (OLED) and the like. The flat display device uses a glass substrate as supporting body configured to support a plurality of fin films. The glass substrate has limitation of lessened thickness. Even if the thickness of the glass substrate is lessened, the glass substrate has a disadvantage of easily-breakable because it has no durability and flexibility.

As a result, flexible displays have been emerging in the market which uses material having a thin thickness and durability, for example, plastic instead of glass substrate having no durability and flexibility.

Compared with the glass substrate, it is easy to change a shape of a plastic film used in such a flexible display because of heat, tension, chemical reaction and moisture absorption and the like. Because of that, an exterior appearance of the flexible substrate has to be put into consideration in each assembly line disadvantageously. Especially, the plastic film happens to be thermal-contractible by 200 ppm at 150° C. If a flexible display is fabricated, using such the plastic film, accuracy of thin-film-inter-layer alignment would deteriorate seriously.

To solve this problem, U.S. Pat. No. 7,202,179 and U.S. Pat. No. 7,521,313 disclose a thin film device having self aligned imprint lithography.

Specifically, according to U.S. Pat. No. 7,202,179, a plurality thin film device layers are deposited on a substrate and an imprinted 3D template structure, such as an imprinted polymer, is then provided on the plurality of thin film device layers. After that, the plurality of thin film device layers and the 3D template structure are etched. This etching forms a rudimentary structure for a thin film device. That is, the formed plurality of thin film device layers is patterned by using multi-stepped resist as mask through a plurality of asking and etching processes. In this case, a problem of multi-layer alignment may be solved because the multi-stepped resist is used in patterning the plurality of thin film device layers. However, undercutting is used to pattern a gate layer which is the lowest layer. Here, it is difficult to perform an undercut process and there is limitation of forming a pattern shape. Also, a gate dielectric layer provided on the gate layer might be floating because of the undercut structure and product reliability would deteriorate accordingly.

According to U.S. Pat. No. 7,512,313, when forming a pattern in an exposed area of a substrate having at least one step, exposed area is treated to provide at least one etch resist area of material. However, the material the surface treating process is applied to is limited and it is difficult to secure that kind of material. Also, the surface treating process is additionally provided and the overall assembly process has to be complicated accordingly.

SUMMARY OF THE DISCLOSURE

Accordingly, the present invention is directed to a thin film transistor substrate and a method for fabricating the same.

An object of the present invention is to provide a thin film transistor substrate capable of performing self alignment and a method for fabricating the same, and a method for fabricating the same.

Additional advantages, objects, and features of the disclosure will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a thin film transistor substrate includes a substrate comprising a plurality of grooves having different depths, respectively, to have a multi-step structure; gate and data lines alternatively crossed in the grooves to form a plurality of pixel areas; thin film transistors formed in the grooves of the substrate to be formed in cross portion of the gate and data lines, wherein active layers of the thin transistors are formed along the gate lines and gate electrodes, the active layers separated from active layers of neighboring pixel areas with the data line located there between.

The substrate may include first to fourth grooves having different heights, respectively, and a first horizontal surface of the substrate may be exposed by the first groove and a second horizontal surface of the substrate may be exposed by the second groove having a lower depth than the first groove and a third horizontal surface of the substrate may be exposed by the third groove having a lower depth than the second groove and a fourth horizontal surface of the substrate may be exposed by the fourth groove having a lower depth than the third groove.

The thin film transistor may include gate electrodes formed on the first and second horizontal surfaces and side surfaces located between each two of the first to third horizontal surfaces; a gate insulator layer formed on a front surface of the substrate; source and drain electrodes formed on the first and fourth horizontal surfaces of the substrate and on the gate insulator layer corresponding to side surfaces located between each two of the second to fourth horizontal surfaces; the active layers formed on the second horizontal surface of the substrate and on the gate insulator layer corresponding to a side surface located between the second and third horizontal surfaces, the active layer overlapped with the gate electrodes with the gate insulator layer located there between to form channels between the source and drain electrodes; and an ohmic contact layer formed between each of the source and drain electrodes and the active layer.

The active layers may be separated from active layers of neighboring pixel areas by the first groove located in both sides of the data lines.

The gate and data lines may be crossed on the third horizontal surface of the substrate, with the gate insulator layer located there between.

A taper angle of a side surface located between the fourth horizontal surface having the source and drain electrodes formed thereon and second horizontal surface having the gate electrodes formed thereon may be smaller than a taper angle of a side surface located between the second horizontal surface having the gate electrodes and gate lines formed thereon and the fifth horizontal surface adjacent to the second horizontal surface.

The thin film transistor substrate may further include a gate pad joined with the gate lines, the gate pad formed on the second horizontal surface; and a data pad joined with the data lines, the data pad formed on the fifth horizontal surface, wherein the gate insulator layer and the active layer are formed to expose the gate pad.

In another aspect of the present invention, a method for fabricating a thin film transistor substrate comprising steps of: forming a substrate comprising a plurality of grooves having different depths, respectively, to have a multi-step structure; and forming gate and data lines, alternatively crossed to form a plurality of pixel areas, and thin film transistors, formed in cross portions of the gate and data lines, in the grooves of the substrate; wherein active layers of the thin transistor are formed along the gate lines and gate electrodes, the active layers separated from active layers of neighboring pixel areas having the data line located there between.

The step of forming the substrate may include steps of: forming an imprint-mold comprising first to fourth projections corresponding to the first to fourth grooves; forming the substrate having the first to fourth grooves by pressing a plastic film, using the imprint-mold; and separating the imprint-mold from the substrate.

The step of forming the gate and data lines and the thin film transistors in the grooves of the substrate may include steps of: forming the gate lines and gate electrodes of the thin film transistors on the first and second horizontal surfaces and on side surfaces located between each two of the first to third horizontal surfaces; forming a gate insulator layer on a front surface of the substrate; forming the active layers on the second horizontal surface of the substrate and on the gate insulator layer corresponding to a side surface located between the second and third horizontal surfaces, the active layers overlapped with the gate electrodes with the gate insulator layer located there between to form channels between the source and drain electrodes; and forming source electrodes, drain electrodes and data lines on the third and fourth horizontal surfaces of the substrate and one side surfaces located between each two of the second to fourth horizontal surfaces.

The step of forming the gate lines and the gate electrodes of the thin transistors may include steps of: forming a gate metal layer on a front surface of the substrate; forming first etch resist patterns on the first to third horizontal surfaces and on side surfaces located each two of the first to third horizontal surfaces; etching the gate metal layer by using the first etch resist patterns as mask; and removing the first etch resist patterns.

The step of forming the active layers according to an embodiment may include steps of: forming a second etch resist pattern on the first horizontal surface of the substrate having the gate insulator layer formed thereon; forming first and second silicon layers on the substrate having the second etch resist pattern formed thereon; removing the second etch resist pattern, the first and second silicon layers on the second etch resist pattern in a lift-off process; forming a third etch resist pattern to cover the first and second horizontal surfaces and the side surface located between each two of the first to third horizontal surfaces; and forming the active layers and an ohmic contact layer on the active layers by etching the first silicon layer, using the third etch resist pattern as mask.

The step of forming the active layers according to another embodiment may include steps of: forming a second etch resist pattern on the first horizontal surface of the substrate having the gate insulator layer formed thereon; forming a first silicon layer on the substrate having the second etch resist pattern formed thereon; removing the second etch resist pattern and the first silicon layer on the second etch resist pattern in a lift-off process; forming a third etch resist pattern to cover the first and second horizontal surfaces and side surfaces located each two of the first to third horizontal surfaces; and forming the active layers by etching the first silicon layer, using the third etch resist pattern as mask.

The step of forming the data lines, the source electrodes and the drain electrodes may include steps of: asking the third etch resist pattern to expose an end of the ohmic contact layer partially; forming a source/drain metal layer on the substrate to cover the ashed third etch resist pattern; forming a fourth etch resist pattern on the first to fourth horizontal surfaces on the source/drain metal layer; etching the source/drain metal layer, using the fourth etch resist pattern as mask; removing the fourth etch resist pattern; and removing the third etch resist pattern and the source/drain metal layer on the third etch resist pattern in a lift-off process.

The step of forming the data lines, the source electrodes and the drain electrodes according to another embodiment may include steps of: asking the third etch resist pattern to expose an end of the active layer partially; forming a second silicon layer and a source/drain metal layer on the substrate to cover the ashed third etch resist pattern; forming a fourth etch resist pattern on the first to fourth horizontal surfaces formed on the source/drain metal layer; forming an ohmic contact layer together with the data lines and the source and drain electrodes by sequentially etching the source/drain metal layer and the second silicon layer, using the fourth etch resist pattern as mask; removing the fourth etch resist pattern; and separating the source and drain electrodes and the ohmic contact layer located between the source and drain electrodes by removing the third etch resist pattern in a lift-off process.

Here, the second etch resist pattern may be level with respect to the gate insulator formed on the second horizontal surface.

The method may further include steps of: forming gate pads on the second horizontal surface, together with the gate lines; forming data pads on the fourth horizontal surface, together with the data lines; and exposing the gate pads by removing the active layer and the gate insulator layer formed on the gate pads.

Specifically, the step of exposing the gate pads may include steps of: coating etch resist on the front surface of the substrate having the source electrodes, the drain electrodes, the data lines and the data pads formed thereon; forming a fifth etch resist pattern by patterning the etch resist after dipping a predetermined portion of the substrate having the gate pads formed thereon; and etching the active layer and the gate insulator layer, using the fifth etch resist pattern as mask.

In a further aspect of the present invention, a flat panel display device includes a thin film transistor substrate; an array substrate opposed to the thin film transistor substrate, the array substrate comprising driving electrodes; and a contact spacer formed between the thin film transistor substrate and the array substrate, to join thin transistors with the driving electrodes, wherein the thin film substrate includes a substrate comprising a plurality of grooves having different depths, respectively, to have a multi-step structure; gate and data lines alternatively crossed in the grooves to form a plurality of pixel areas; thin film transistors formed in the grooves of the substrate to be formed in cross portion of the gate and data lines, wherein active layers of the thin transistors are formed along the gate lines and gate electrodes, the active layers separated from active layers of neighboring pixel areas with the data line located there between.

According to the present invention, the substrate including the plurality of the grooves having different depths, respectively, may be provided and a thin film patterns are formed in the grooves of the substrate. Because of that, a structure allowing a broad area may be designable and it is advantageous to apply a resist printing process to the present invention. Also, the thin film may be formed without an alignment process according to the present invention. Because of that, self-alignment is possible. The thin film pattern according to the present invention is not formed in the undercut structure and its assembling process efficiency and reliability may be improved accordingly.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the disclosure and are incorporated in and constitute a part of this application, illustrate embodiment(s) of the disclosure and together with the description serve to explain the principle of the disclosure.

In the drawings.

DESCRIPTION OF SPECIFIC EMBODIMENTS

Reference will now be made in detail to the specific embodiments of the present invention, examples of which are illustrated in the accompanying drawings. Wherever possible, the same reference numbers will be used throughout the drawings to refer to the same or like parts.

Figure 1:
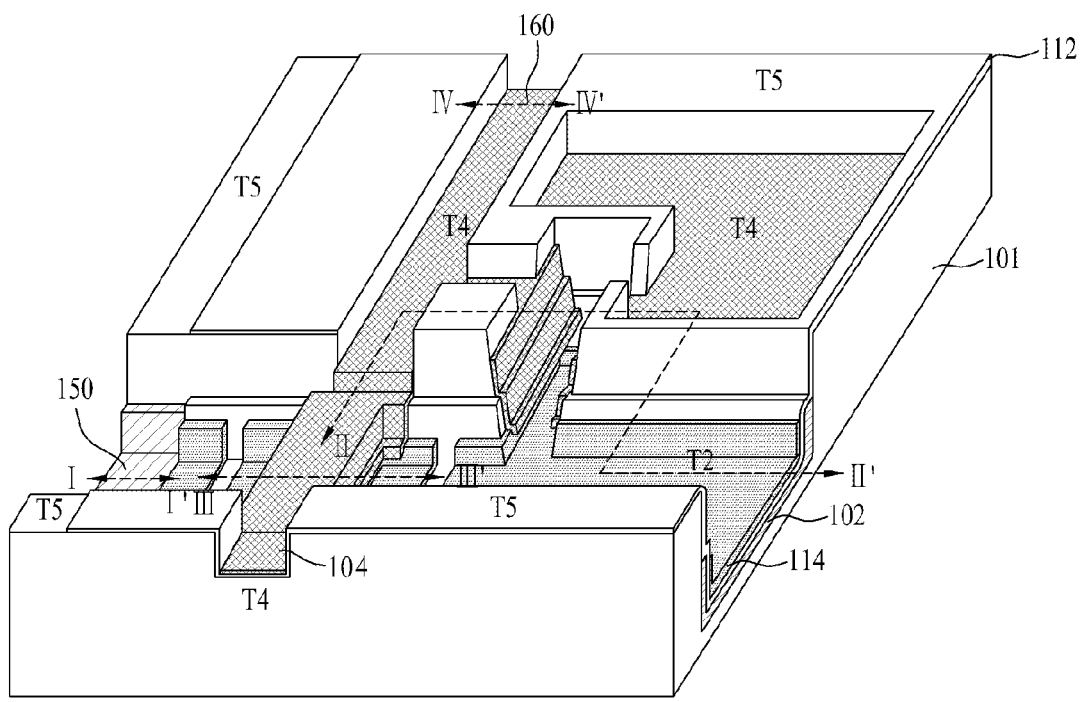
FIG. 1 is a perspective view illustrating a thin film transistor substrate according to an exemplary embodiment of the present invention.
Figure 2:
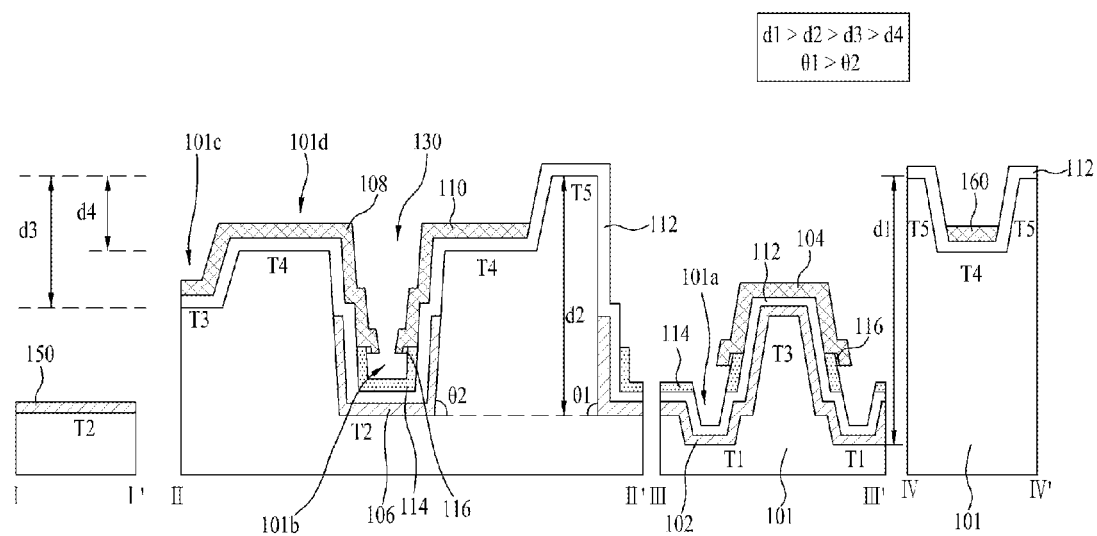
FIG. 2 is a sectional view illustrating the thin film transistor substrate cur away along "I-I", "||-||" and "|||-|||" lines of FIG. 1.

FIGS. 1 and 2 are a perspective view and a sectional view illustrating a thin film transistor substrate according to an exemplary embodiment of the present invention.

The thin film transistor substrate shown in FIGS. 1 and 2 includes a substrate 101, gate lines 102 and data lines 104 alternatively formed on the substrate 101, with a gate insulator layer 112 provided there between, and a thin film transistor 130 adjacent to a cross portion of two gate and data lines. A thin film transistor substrate includes a gate pad 150 joined to the gate line 102 and a data pad 160 joined to the data line 104.

The substrate 101 has first to fifth horizontal surfaces (T1, T2, T3, T4 and T5) having gradually increasing heights and it forms a multi-stepped structure. The first horizontal surface (T1) is exposed by a first groove (101a) having a first depth (d1). The second horizontal surface (T2) is exposed by a second groove (101b) having a second depth lower than the first depth (d1). The third horizontal surface (T3) is exposed by a third groove 101c having a third depth (d3) lower than the second depth (d2). The fourth horizontal surface (T4) is exposed by a fourth groove 101d having a fourth depth (d4) lower than the third depth (d3).

Especially, the first horizontal surface (T1) is located between neighboring two pixel areas to separate channels of the pixel areas from each other. That is, the first horizontal surface (T1) is formed in a predetermined area corresponding to gate lines located in both opposite sides of a data line located between the gate lines. Active layers 114 are not formed in the first groove 101a of the first horizontal surface (T1) and the channels of the neighboring pixel areas are separated.

The third horizontal surface (T3) is corresponding to a cross area of the gate and data lines 102 and 104.

The fifth horizontal surface (T5) is corresponding to an area having the largest height of the substrate 101, except the areas corresponding to the first to fourth horizontal surfaces (T1, T2, T3 and T4). Especially, a taper angle of the fifth horizontal surface (T5) may be adjusted based on close horizontal surfaces to prevent short circuit between the data line 104 and a drain electrode 110 and between a source electrode 108 and the drain electrode 110. that is, a taper angle (θ 1) of the side surface located between the second horizontal surface (T2) in which a gate electrode 106 and the gate line 102 formed and the fifth horizontal surface (T5) adjacent to the second horizontal surface (T2) may be larger than a taper angle (θ 2) of the side surface located between the fourth horizontal surface (T4) in which the source and drain electrodes 108 and 110 are formed and the second horizontal surface (T2) in which the gate electrode 106 is formed. Because of that, the source and drain electrodes 108 and 110 and the data line 104 may not be extended to the fifth horizontal surface (T5) and the sides surfaces located between the second horizontal surface (T2) adjacent to the fifth horizontal surface (T5) and neighboring fifth horizontal surface (T5), such that the short circuit between them may be prevented.

Such the substrate 101 may be formed of plastic film made of at least one organic material selected out of Polyethylene Naphthalate (PEN), Polyethylene Terephthalate (PET), Polyethylene Ether Phthalate, Polycarbonate, Polyimide and Polyacrylate.

The thin film transistor 130 is formed in the second groove 101b of the substrate and it includes the gate electrode 106, the source electrode 108, the drain electrode 110, the active layer 114 and an ohmic contact layer 116.

The gate electrode 106 is joined to the gate line 102 and the source electrode 108 is joined to the data line 104. the drain electrode 110 is opposed to the source electrode 108 and the active layer 114 is overlapped with the gate electrode 106, with the gate insulator layer 112 located there between, to form a channel between the source electrode 108 and the drain electrode 110. The ohmic contact layer 116 is formed on a predetermined area of the active layer 114 except the channel area, to ohmic-contact with the source and drain electrodes 108 and 110.

The gate electrode 106 is joined to the gate line 102 and it is formed on the first to third horizontal surfaces (T1, T2 and T3) of the substrate 101 and the side surfaces located between two of them. The source electrode 108 is formed on the fourth horizontal surface (T4) of the substrate 101 and the side surfaces located between two of the second to fourth horizontal surfaces, to be joined to the data line 104. the drain electrode 110 is formed on the fourth horizontal surface (T4) of the substrate 101 and the side surfaces located between two of the second to fourth horizontal surfaces (T2, T3 and T4), to be opposed to the source electrode 108. The active layer 114 is formed on the first horizontal surface (T1) of the substrate and the side surfaces located between the first and second horizontal surfaces (T1 and T2), along the gate line 102 and the gate electrode 106. Such the active layer 114 is formed overlapping with the gate electrode 106, having the gate insulator layer 112 located there between, and it forms the channel between the source electrode 108 and the drain electrode 110. In addition, the active layer 114 is separated from another active layer of a neighboring pixel area by the first groove 101a formed in both sides of the data line 104.

The ohmic contact layers 116 may be formed between the source electrode 108 and the drain electrode 110 and between each data line 104 and the active layer 114, respectively. Especially, the ohmic contact layer 116 is formed on the active layer 114, except the channel area, to ohmic-contact with the source electrode 108 and the drain electrode 110.

The gate line 102 is formed in the first and second grooves 101a and 101b of the substrate 101 and it is joined with a gate driver (not shown) via the gate pad 150. The data pad 150 is formed in the second groove 101b having the second depth (d2) formed in the substrate, with extended from the gate line 102 on the second horizontal surface (T2). The gate insulator layer 112 is not formed on such the gate pad 150 and the gate pad 150 is exposed outside accordingly.

The data lines 104 are formed in the third and fourth grooves 101c and 101d of the substrate and it is joined with a data driver (not shown) via the data pad 160. The data pad 160 is formed in the fourth groove 101d, with extended from the data line 104 on the fourth horizontal surface (T4) of the substrate 101.

As follows, a method for fabricating the thin film transistor substrate according to the present invention shown in FIGS. 1 and 2 will be described.

Figure 3A:
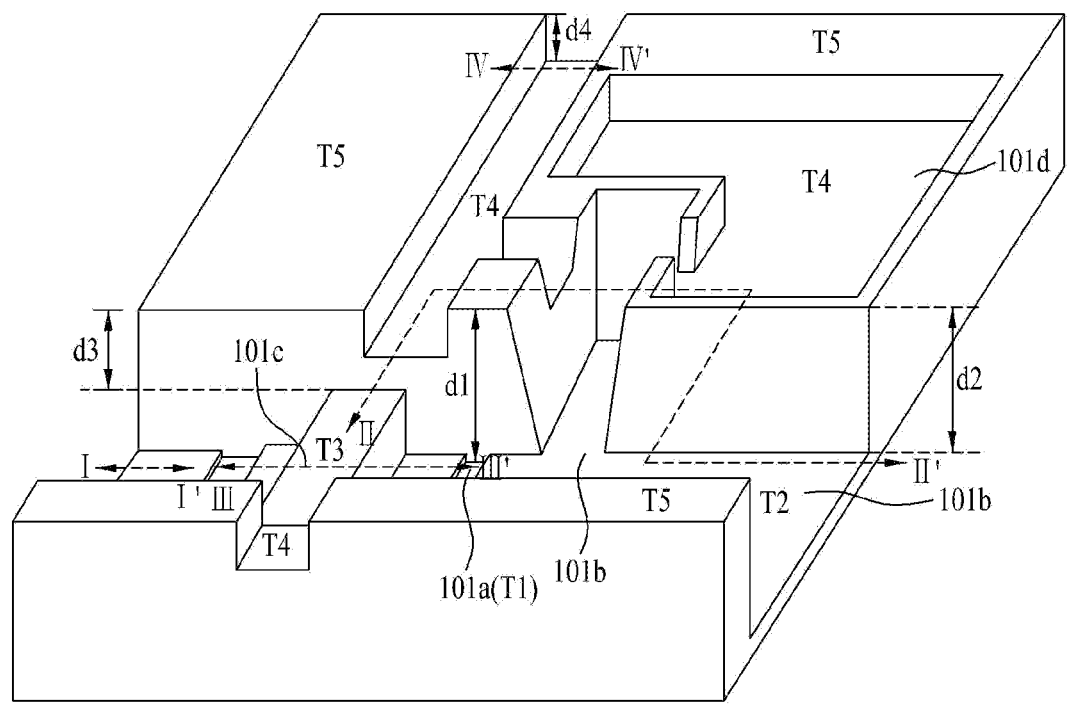
FIGS. 3A and 3B are perspective and sectional views to illustrate a method for fabricating the thin film transistor substrate having a multi-stepped structure in detail.
Figure 3B:
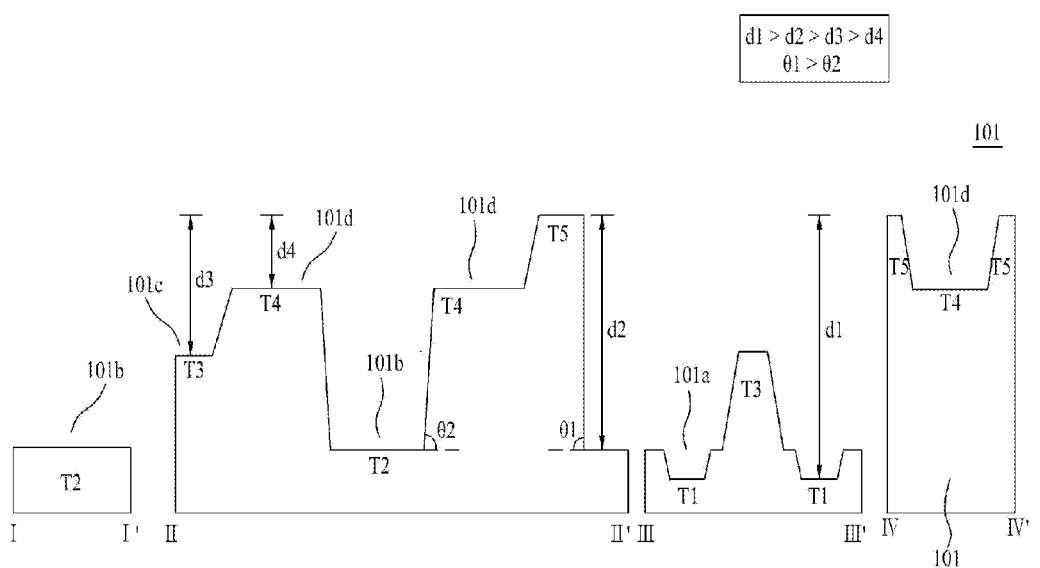

FIGS. 3A and 3B are perspective and sectional views to explain a fabricating process of the substrate having multi-steps provided in the thin film transistor substrate.

As shown in FIGS. 3A and 3B, the substrate 101 having the first to fifth horizontal surfaces (T1, T2, T3, T4 and T5) located with different heights, respectively, may be provided. The first horizontal surface (T1) is exposed via the first groove (101a) having the first depth (d1) and the second horizontal surface (T2) is exposed via the second groove 101b having the second depth (d2) lower than the first depth (d1). The third horizontal surface (T3) is exposed via the third groove 101c having the third depth (d3) lower than the second depth (d2) and the fourth horizontal surface is exposed via the fourth groove 101d having the fourth depth (d4) lower than the third depth (d3). The fifth horizontal surface (T5) is located at the highest position of the substrate 101 higher than the fourth horizontal surface (T4). In addition, the taper angle (θ 1) of the side surface exposed between the second horizontal surface (T2) of the substrate 101 is larger than the taper angle (θ 2) of the side surface exposed between the second horizontal surface (T2) and the fourth horizontal surface (T4).

Figure 4A:
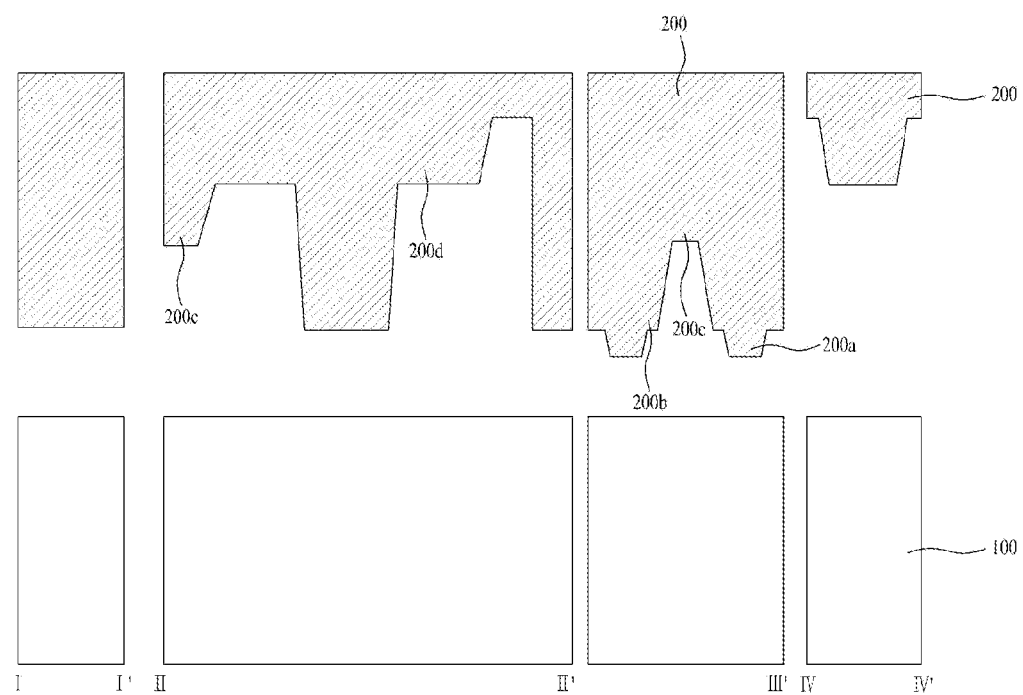
FIGS. 4A and 4C are sectional views to illustrate a method for fabricating the thin film transistor substrate having a multi-stepped structure in detail.
Figure 4B:
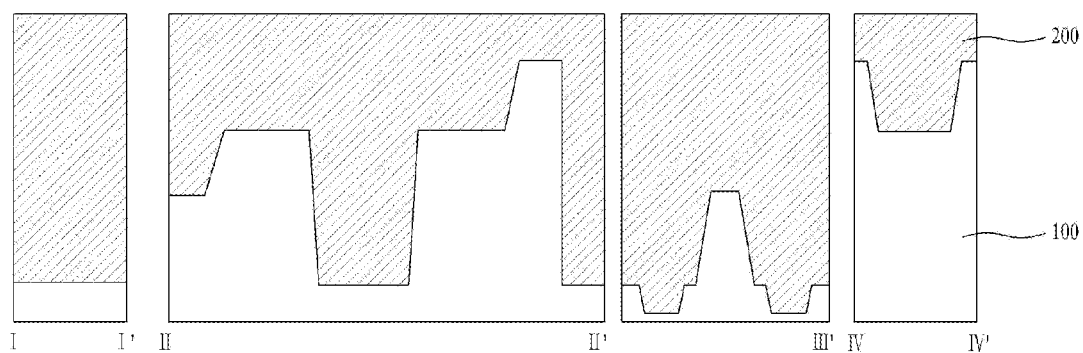
Figure 4C:
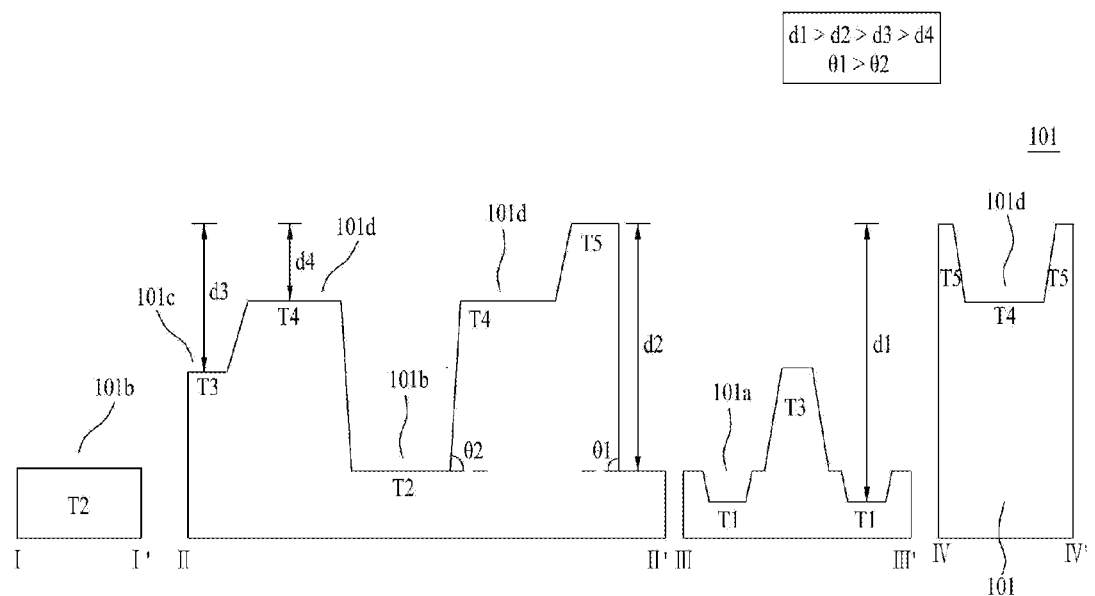

Specifically, as shown in FIG. 4A, an imprint-mold 200 having a plurality of projections 200a, 200b, 200c and 200d may be aligned on a plastic film 100. The imprint-mold 200 includes first to fourth projections 200a, 200b, 200c and 200d having sequentially lowered heights, respectively. The first projection 200a has a predetermined first height, corresponding to the area located in the neighboring pixel area in which the active layer forming the channel of the thin film transistor is separated. The second projection 200b has a second height lower than the first height, corresponding to the area in which the first conductor pattern group having the gate electrode and the gate pad will be formed. The third projection 200c has a third height lower than the second height, corresponding to the crossed area between the data line and the gate line. The fourth projection 200d has a predetermined height lower than the third height, corresponding to the area in which the second conductor group having the data line, the source electrode, the drain electrode and the data pad will be formed. Such the imprint-mold 200 may be made of rubber material having high elasticity, for example, Poly Dimethyl Siloxane (PDMS) and the like. The imprint-mold 200 presses the plastic film 100 with its weight and the imprint mold 200 is separated from the plastic film 100, as shown in FIG. 4B. then, as shown in FIG. 4C, there may be formed the first to fourth grooves 101a, 101b, 101c and 101d having reversal-transferred patterns of the first to fourth projections 200a, 200b, 200c and 200d and the substrate 101 having the first to fifth horizontal surfaces T1, T2, T3, T4 and T5. Here, the first groove 101a has the first depth (d1) corresponding to the height of the first projected pattern 200a of the imprint-mold 200 and the second groove 101b has the second depth (d2, de<d1) corresponding to the height of the second projected pattern 200b.

the third groove 101c has the third depth (d3, d3<d2) corresponding to the height of the third projected pattern 200c of the imprint-mold 200 and the fourth groove 101d has the fourth depth (d4, d4<d3) corresponding to the height of the fourth projected pattern 200d of the imprint-mold 200. in addition, the taper angle (θ 1) of the side surface exposed between the second horizontal surface (T2) and the fifth horizontal surface (T5) may be larger than the taper angle (θ 2) of the side surface exposed between the second horizontal surface (T2) and the fourth horizontal surface (T4).

Figure 5A:
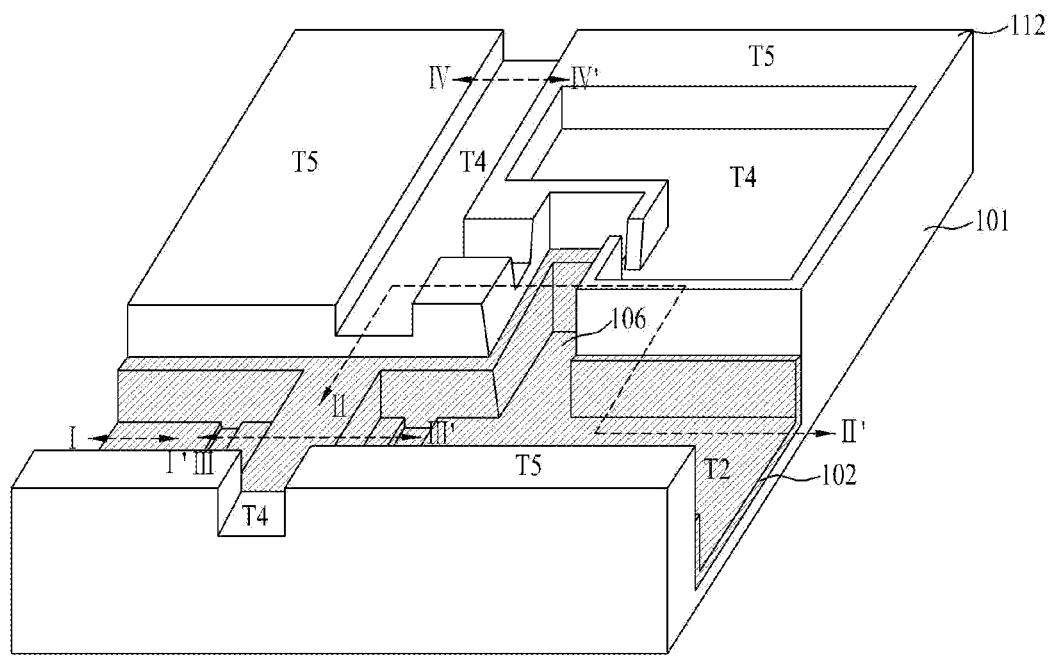
FIGS. 5A and 5B are perspective and sectional views to illustrate a method for fabricating a first conductor pattern group of the thin film transistor according to the above embodiment of the present invention.
Figure 5B:
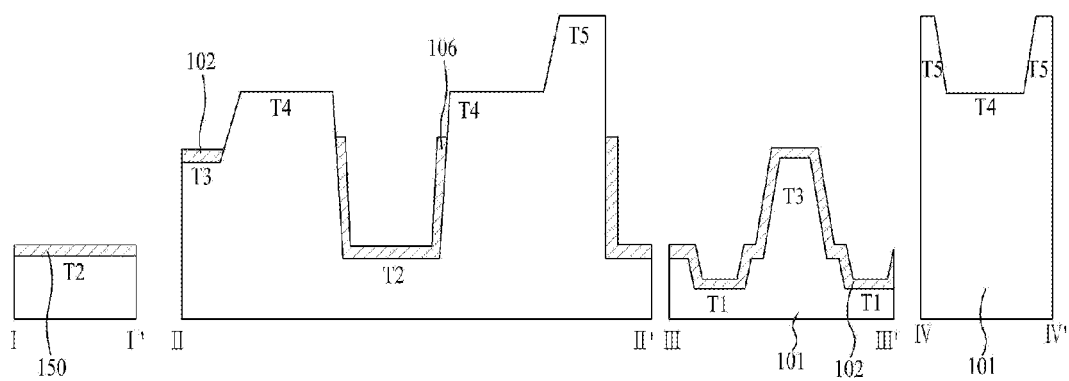

FIGS. 5A and 5B are perspective and sectional views to explain a fabricating process of the first conductor pattern group of the thin film transistor substrate according to the present invention.

As shown in FIGS. 5A and 5B, the first conductor pattern group including the gate line 102, the gate electrode 106 and the gate pad 150 is formed on the first to third horizontal surfaces (T1, T2 and T3) and the side surfaces located between each two of the horizontal surfaces.

Figure 6A:
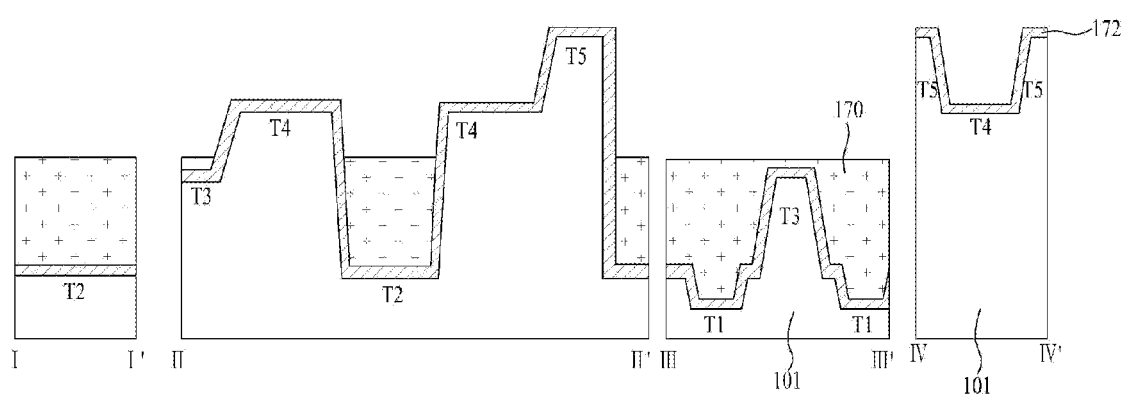
FIGS. 6A to 6C are sectional views to illustrate a method for fabricating a first conductor pattern group of the thin film transistor according to the above embodiment of the present invention.
Figure 6B:
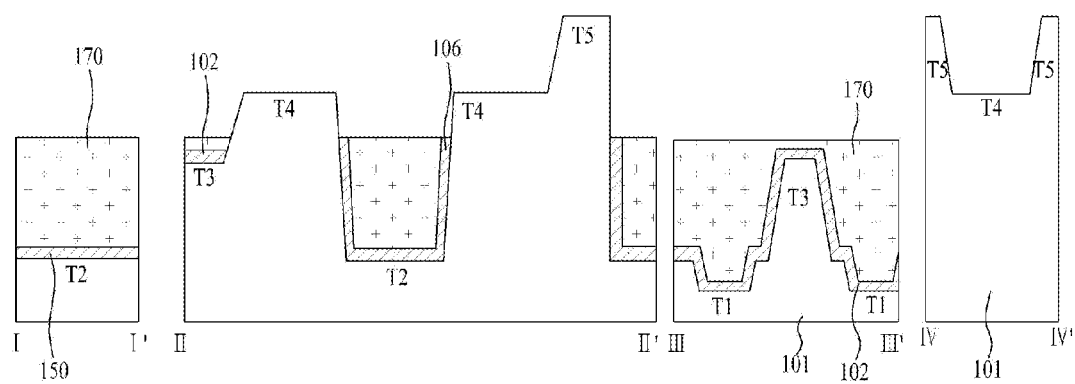
Figure 6C:
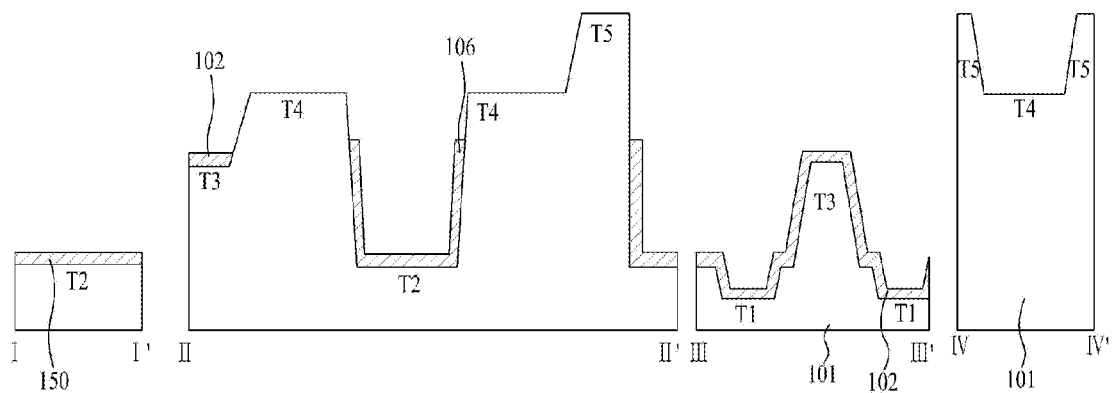

Specifically, as shown in FIG. 6A, a gate metal layer 172 and a first etch resist are sequentially formed on a top surface of the substrate 101. The gate metal layer 172 is formed of aluminum, copper or molybdenum and the first etch resist is formed of acrylic resin or novolac resin which have tolerance to etchant of the gate metal layer. After that, the first etch resist is asked in a plasma ashing process, under an atmospheric pressure or vacuum state and a first etch resist pattern 170 is formed. Gas mixture of O2, NF3, SF3, N2, Clean dry air (CDA) is used as ashing gas. The first etch resist pattern 170 is removed from the fourth and fifth horizontal surfaces (T4 and T5) of the substrate, with formed on the first to third horizontal surfaces (T1~T3) and on the side surfaces located between each two of the first to third horizontal surfaces. The gate metal layer 172 is etched by using the first etch resist pattern 170 as mask. Because of that, the first conductor pattern group including the gate line 102, the gate electrode 106 and the gate pad 150 is formed as shown in FIG. 6B. The first conductor pattern group is formed on each of the first to third horizontal surfaces (T1~T3) and on the side surfaces located on each two of the first to third horizontal surfaces. As shown in FIG. 6C, the first etch resist pattern 170 remaining on the first conductor pattern group is removed in a strip process.

Figure 7A:
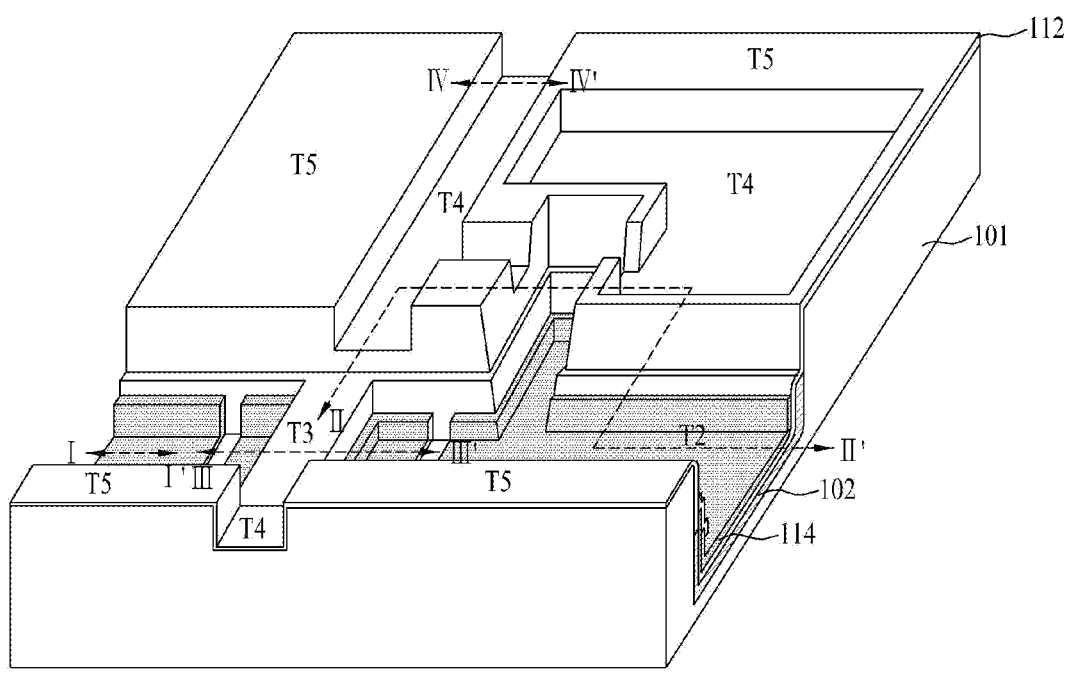
FIGS. 7A and 7B are perspective and sectional views to illustrate a method for fabricating a semiconductor layer of the thin film transistor substrate according to the embodiment of the present invention.
Figure 7B:
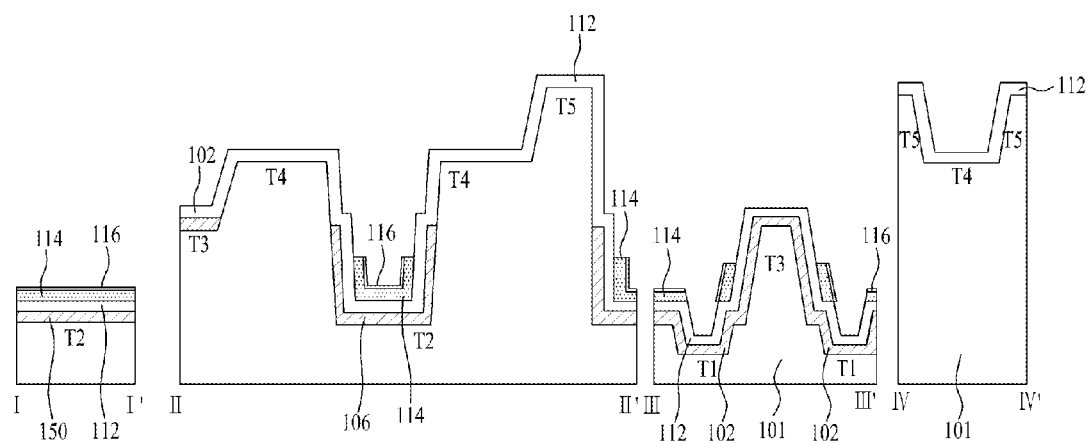

FIGS. 7A and 7B are a perspective view and a sectional view to explain a method for fabricating the gate insulator layer, the active layer and the ohmic contact layer on the thin film transistor substrate according to the present invention. Although the ohmic contact layer is not shown in FIG. 7A, the ohmic contact layer is formed in the same pattern of the active layer as shown in FIG. 7B.

As shown in FIGS. 7A and 7B, the gate insulator layer 112 is formed on a top surface of the substrate 101 having the first conductor pattern group formed thereon. The active layer 114 and the ohmic contact layer 116 are formed on the second horizontal surface T2 and the side surfaces located between the second and third horizontal surfaces T2 and T3, with the same patterns. Here, the height of the active layer 114 formed on the side surface located between the second and third horizontal surfaces may be lower than the height of the gate electrode 106 formed between the side surface located between the second and third horizontal surfaces.

Figure 8A:
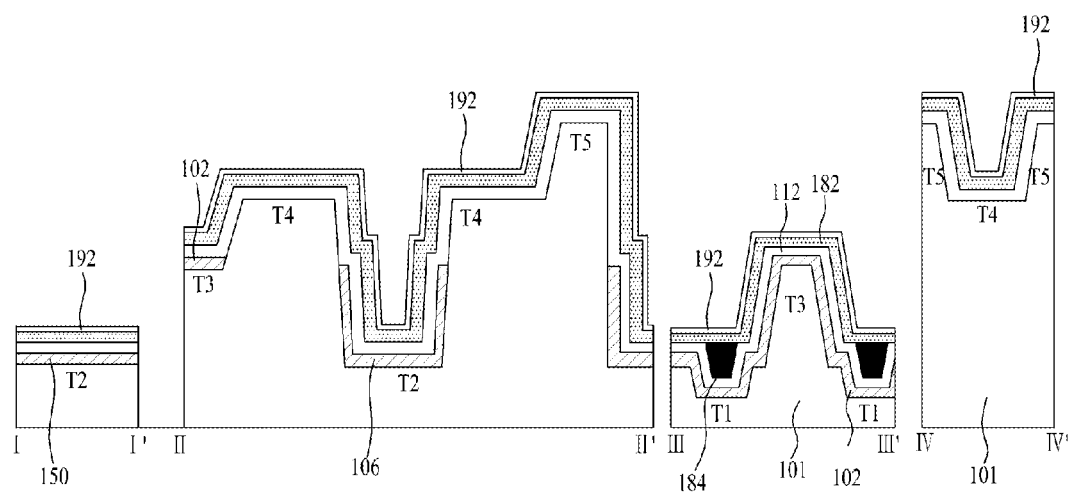
FIGS. 8A to 8D are sectional views to illustrate a method for fabricating the semiconductor layer of the thin film transistor substrate according to the embodiment of the present invention.
Figure 8B:
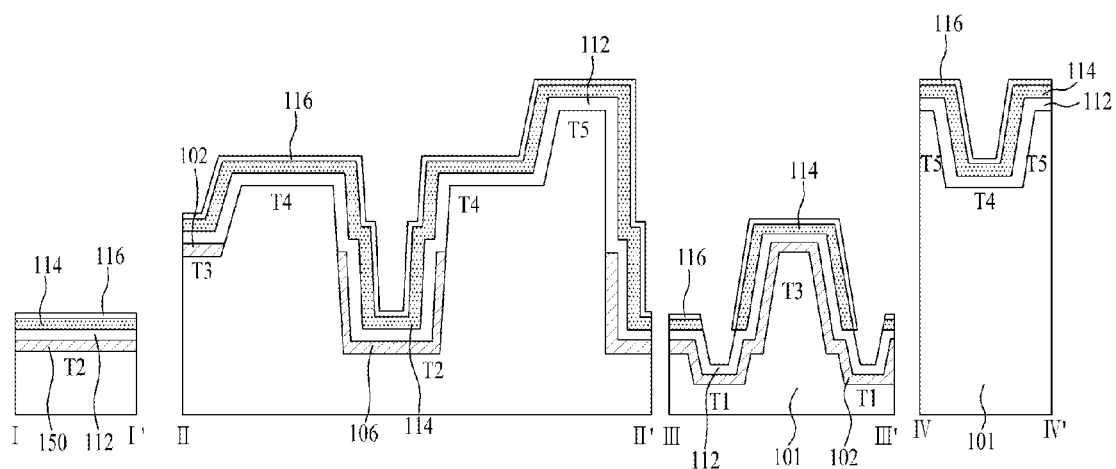

Specifically, as shown in FIG. 8A, the gate insulator layer 112 and the second etch resist are sequentially layered on the surface of the substrate 101 having the first conductor pattern group formed thereon. After that, a second etch resist is asked in the plasma ashing process, under the atmospheric pressure or vacuum state, and a second etch resist pattern 184 is then formed. Here, gas mixture of O2, NF3, SF3, N2 and CDA is sued as ashing gas. The second etch resist pattern 184 is removed from the second to fifth horizontal surfaces T2, T3, T4 and T5 and the side surfaces located between each two of them, only to remain on the first horizontal surface T1. in other words, the second etch resist pattern 184 is formed on front and side surfaces of the gate insulator layer 112 formed on the first horizontal surface T1, with a predetermined thickness to be level with the gate insulator layer 112 formed on the second horizontal surface T2. An amorphous silicon layer 182 having impurity (n+ or p+) doped thereon and an intrinsic amorphous silicon layer 192 is layered on the substrate 101 having such the second etch resist pattern 184 formed thereon. After that, the second etch resist pattern 184 and the amorphous silicon layer 182 and the amorphous silicon layer 192 having the impurity (n+ or p+) doped thereon, which are formed on the second etch resist pattern 184, may be removed together in a lift-off process. After that, as shown in FIG. 8B, the impurity (n+ or p+) doped amorphous silicon layer 192 formed on the gate insulator layer 112 on the first horizontal surface T1 of the substrate 101 may be patterned to be removed, and then the active layer 114 and the ohmic contact layer 116 are formed. As a result, a semiconductor layer including the active layers 114 configured to form channels of neighboring pixels are separated from a semiconductor layer including the ohmic contact layers 116 for ohmic-contact, with the data lines 104 located there between. In other words, semiconductor layers 114 and 116 formed in cross areas of the gate and data lines 102 and 104 may be separated from semiconductor layers 114 and 116 formed on the gate lines 102 located right and left sides of the semiconductor layers 114 and 116, to be formed in an island shape.

Figure 8C:
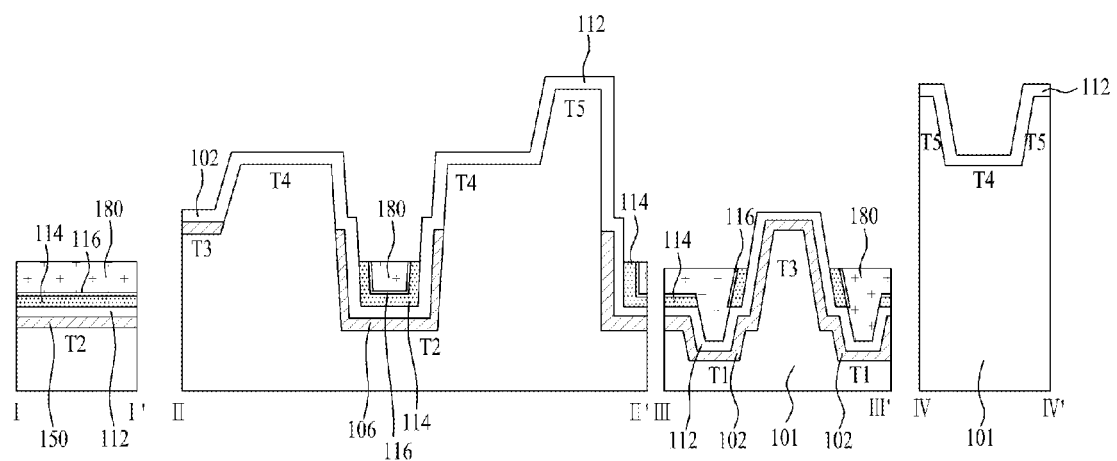
Figure 8D:
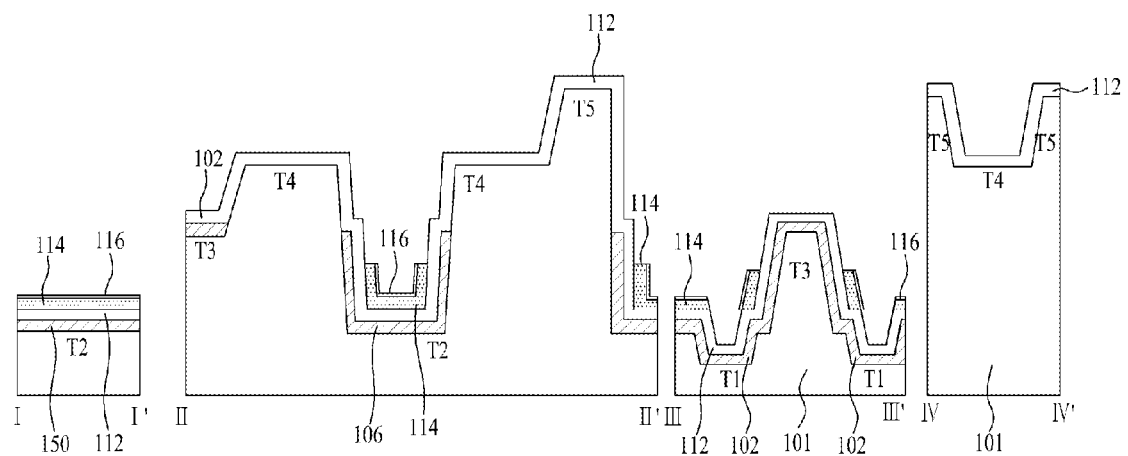

Hence, as shown in FIG. 8C, a third etch resist is layered on the substrate 101 having the semiconductor layers 114 and 116 formed thereon. Here. The first etch resist may be acrylic resin or novolac resin having tolerance to the etchant of the semiconductor layer. After that, the third etch resist is asked in the plasma ashing process, under the atmospheric pressure or vacuum state, and a third etch resist pattern 180 is then formed. Gas mixture of O2, NF3, N2 and CDA is used as ashing gas. The third etch resist pattern 180 is formed on to the third to fifth horizontal surfaces T3, T4 and T5 and the side surfaces located between each two of them, to be removed. The third etch resist pattern 180 is used as mask in etching the semiconductor layer 114 and 116 as shown in FIG. 8C. After that, the semiconductor layers 114 and 116 may be formed on the second horizontal surfaces T2 and the side surfaces located between the second and third horizontal surfaces T2 and T3. As shown in FIG. 8D, the third etch resist pattern 180 remaining on the semiconductor layers 114 and 116 may be removed in the strip process.

Figure 9A:
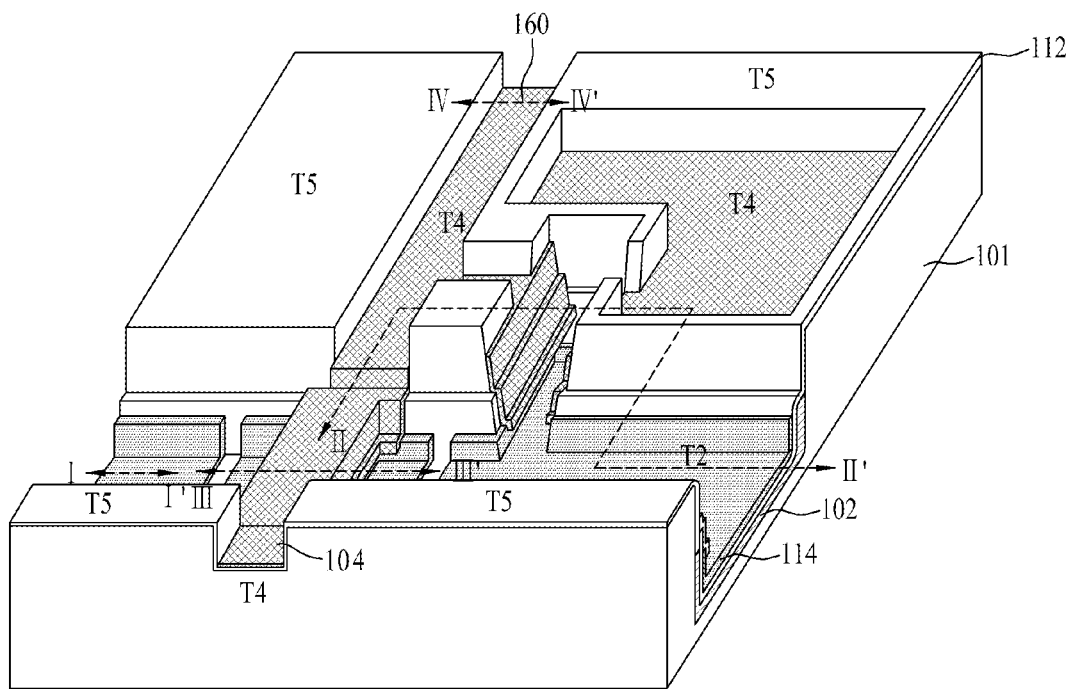
FIGS. 9A and 9B are perspective and sectional views to illustrate a method for fabricating a second conductor group of the thin film transistor substrate according to the embodiment of the present invention.
Figure 9B:
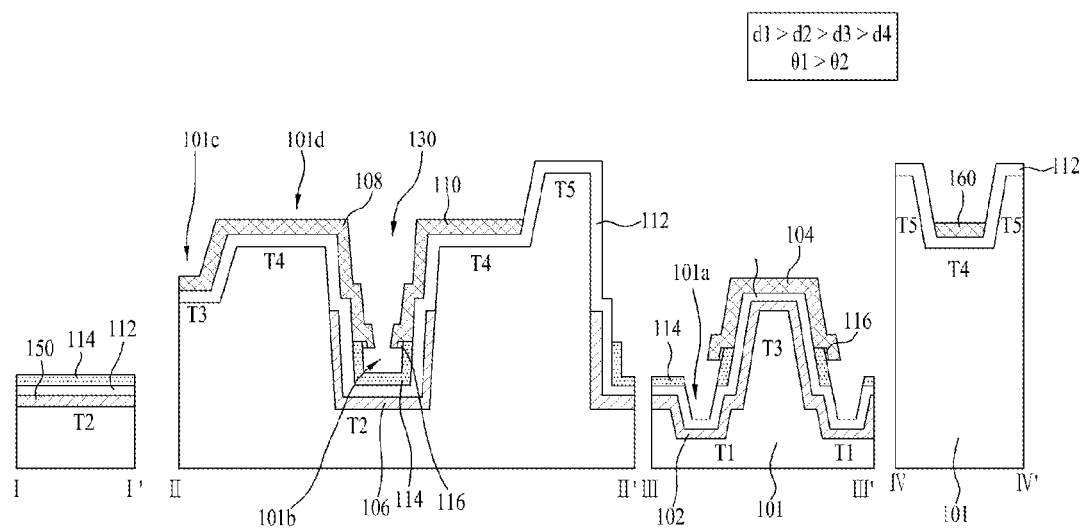

FIGS. 9A and 9B are a perspective view and a sectional view to explain a method for fabricating the second conductor pattern group and the ohmic contact layer.

As shown in FIGS. 9A and 9B, the second conductor pattern group including the source electrode 108, the drain electrode 110, the data line 104 and the data pad 160 is formed on the third and fourth horizontal surfaces T3 and T4, the side surfaces located between the two horizontal surfaces and the side surface located between the second and third horizontal surfaces. Here, the source electrode 108 and the drain electrode 110 are partially formed on the side surface located between the second and third horizontal surfaces T2 and T3, to be overlapped with the gate electrode 106 and the active layer 114.

Figure 10A:
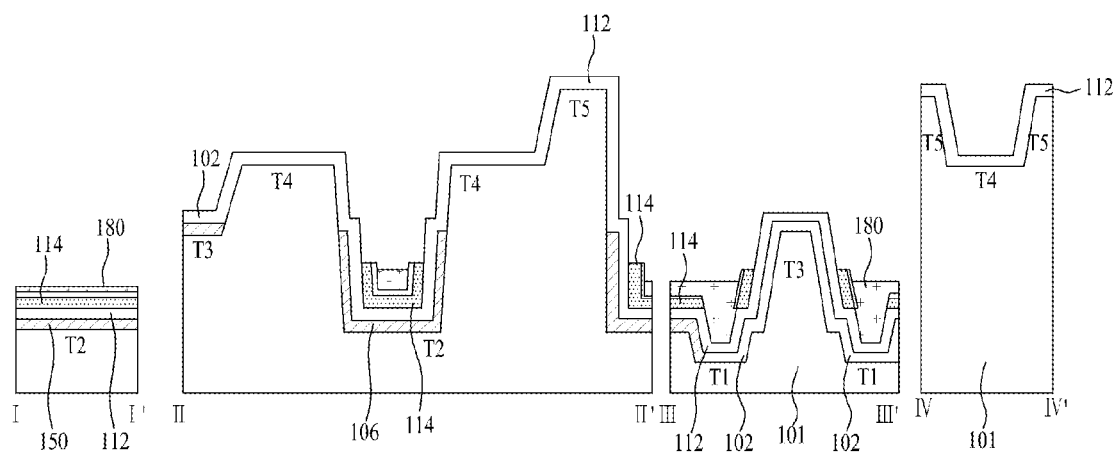
FIGS. 10A to 10E are sectional views to illustrate a method for fabricating the second conductor group of the thin film transistor substrate according to the embodiment of the present invention.

Specifically, as shown in FIG. 10A, the etch resist is coated and ashed on the substrate 101, and then the etch resist pattern to partially expose an end of the ohmic contact layer 116 is formed. Instead of such the method, the third etch resist pattern 180 remaining on the active layer 114 shown in FIG. 8C is ashed, not removed in the strip process. As follows, the method of patterning by using the third etch resist pattern 180 shown in FIG. 8C will be described. That is, the third etch resist pattern 180 is ashed and it is formed to expose a predetermined part of the end of the ohmic contact layer 116 located on the side surface between the second and third horizontal surfaces T2 and T3.

Figure 10B:
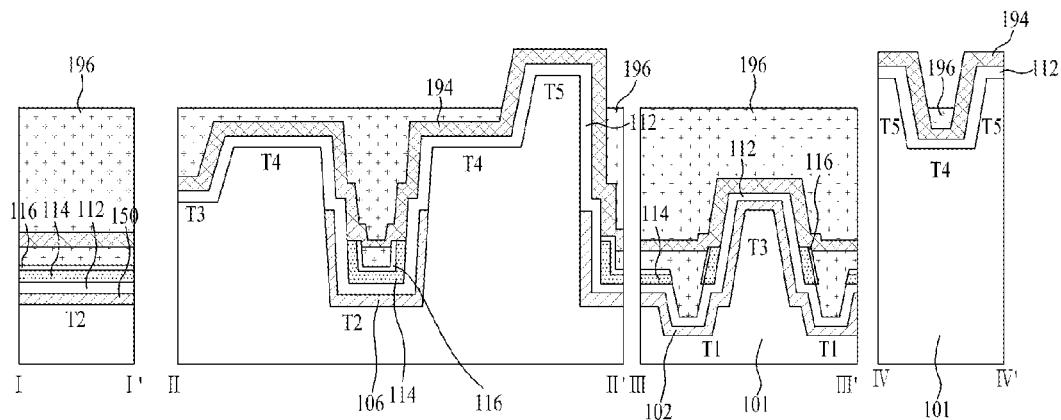

Hence, as shown in FIG. 10B, a source/drain metal layer 194 and a fourth etch resist may be sequentially formed on a front surface of the substrate 101 having the third etch resist pattern 180 formed thereon. Here, the fourth etch resist is formed of acrylic resin or novolac resin having tolerance to etchant of the source/drain metal layer. After that, the fourth etch resist is asked in the plasma ashing process, under the atmospheric pressure or vacuum state, and a fourth etch resist pattern 196 is then formed. Gas mixture of O2, NF3, SF3, N2 and CDA is used as ashing gas. The fourth etch resist pattern 196 is removed from the fifth horizontal surface T5 and the side surface located between the fourth and fifth horizontal surfaces T4 and T5, to remain the other area of the substrate 101.

Figure 10C:
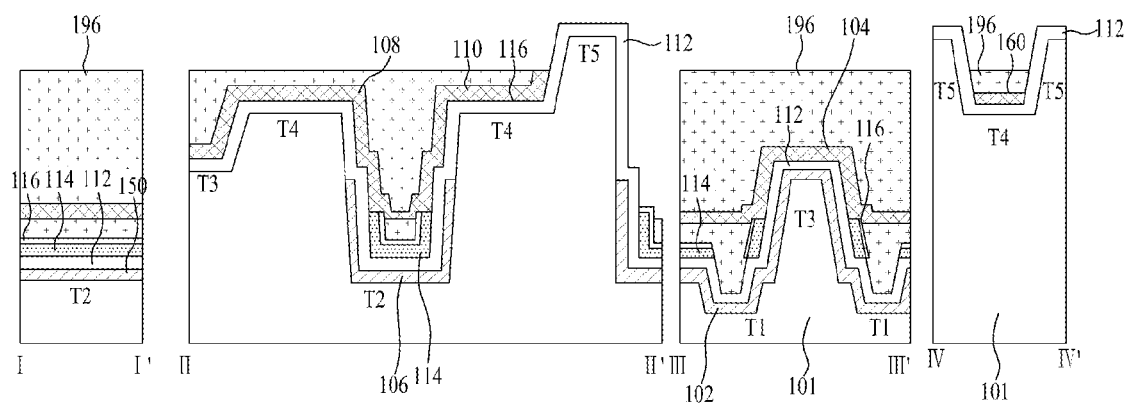
Figure 10D:
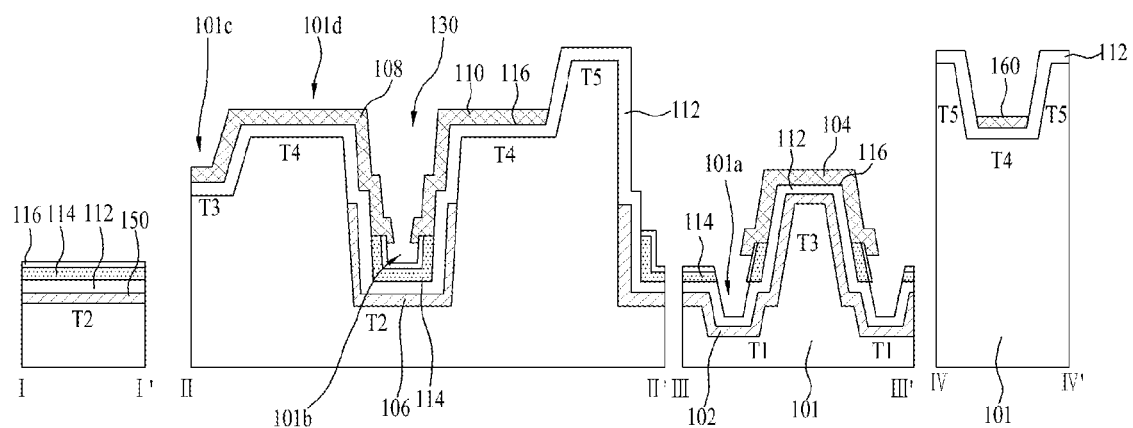
Figure 10E:
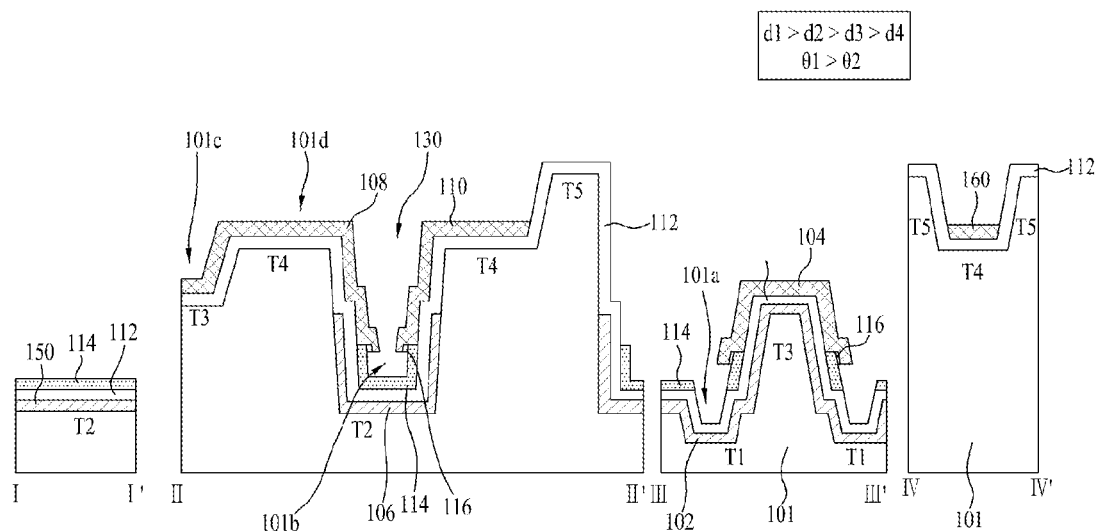

Hence, as shown in FIG. 10C, the source/drain metal layer 194 is etched by using the fourth etch resist pattern 196 as mask. Because of that, the second conductor pattern group including the source and drain electrodes 108 and 110, the data line 104 and the data pad 160 may be formed, each of them connected with each other. As shown in FIG. 10d, the fourth etch resist pattern 196 remaining on the second conductor pattern group is removed in the strip process. After that, the third etch resist pattern 180 and the source and drain electrodes are removed together in the lift-off process, to separate the source and drain electrodes 108 and 110. then, the ohmic contact layer 116 located between the source and drain electrodes 108 and 110 is removed in an etching process using the source and drain electrodes 108 and 110 as mask, to expose the active layer 114 and to remove the ohmic contact layer 116 not overlapped with the active layer 114 on the gate pad 150 and the gate line 102.

In the meanwhile, the third conductor pattern group is not formed on the side surface located between the second and fifth horizontal surfaces T2 and T5 to prevent short circuit generated between the source and drain electrodes 108 and 110 and between the source electrode 108 and the data line 104. specifically, a first taper angle ($\theta 1$) between the second horizontal surface T2 and the side surface located between the second horizontal surface and the neighboring fifth horizontal surface T5 may be larger than a second taper angle ($\theta 2$) between the other side surfaces. When the source/drain metal layer 194 is deposited on such the substrate 101, the source/drain metal layer 194 cannot be deposited on the side surface located between the second and fifth horizontal surfaces T2 and T5 of the substrate which has the relatively large taper angle. Because of that, the source/drain metal layer 194 would be formed with a relatively smaller thickness, compared with the other area of the substrate. In this case, the source/drain metal layer 194 located on the side surface between the second and fifth horizontal surfaces T2 and T5, corresponding to the first taper angle ($\theta 1$), has a higher etching rate than the source/drain metal layer 194 located on the side surfaces corresponding to the second taper angle. Also, the etchant infiltration velocity to the side surface located between the second and fifth horizontal surfaces T2 and T5 corresponding to the first taper angle ($\theta 1$) is higher than the etchant infiltration velocity to the other area. because of that, the etching rate of the source/drain metal layer 194 located on the side surface between the second and fifth horizontal surface T2 and T5 corresponding to the taper angle ($\theta 1$) is higher. The source/drain metal layer 194 located in the side surface between the second and fifth horizontal surfaces T2 and T5 corresponding to the first taper angle ($\theta 1$) may be removed completely. Then, the source/drain metal layer 194 on the fourth horizontal surface T4 is also etched, except the side surface between the second and fifth horizontal surfaces T2 and T5 corresponding to the first taper angle ($\theta 1$), and the area of the fourth horizontal surface T4 is relatively large enough not to affect the pattern representation.

Figure 11A:
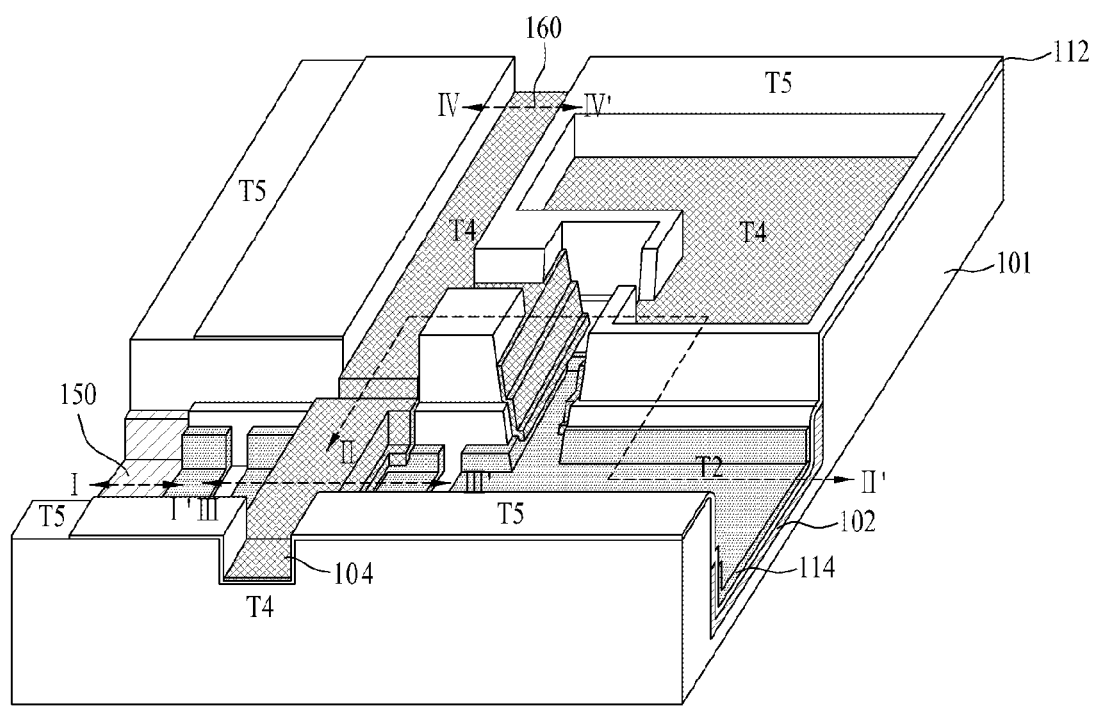
FIGS. 11A and 11B are perspective and sectional views to illustrate a process of removing a gate insulator layer and an active layer provided on a gate pad of the thin film transistor substrate according to the above embodiment of the present invention.
Figure 11B:
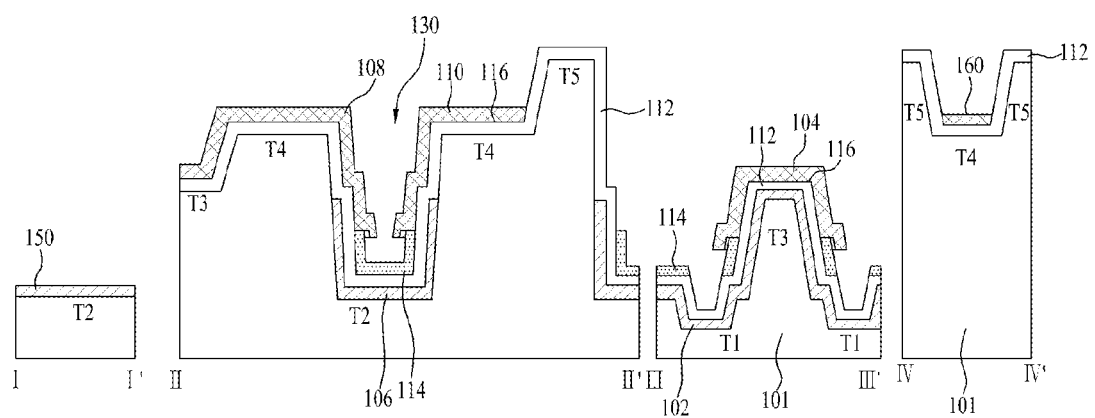

FIGS. 11A and 11B are a perspective view and a sectional view to explain a removing process of the gate insulator layer and active layer on the gate pad of the thin film transistor substrate.

Figure 12A:
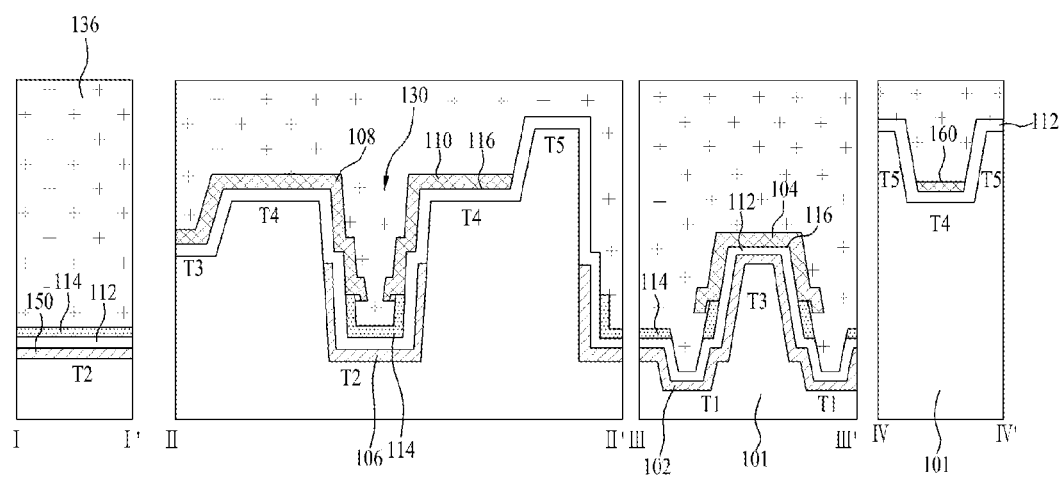
FIGS. 12A to 12D are sectional views to illustrate the process of removing the gate insulator layer and the active layer provided on the gate pad of the thin film transistor substrate according to the above embodiment of the present invention.
Figure 12B:
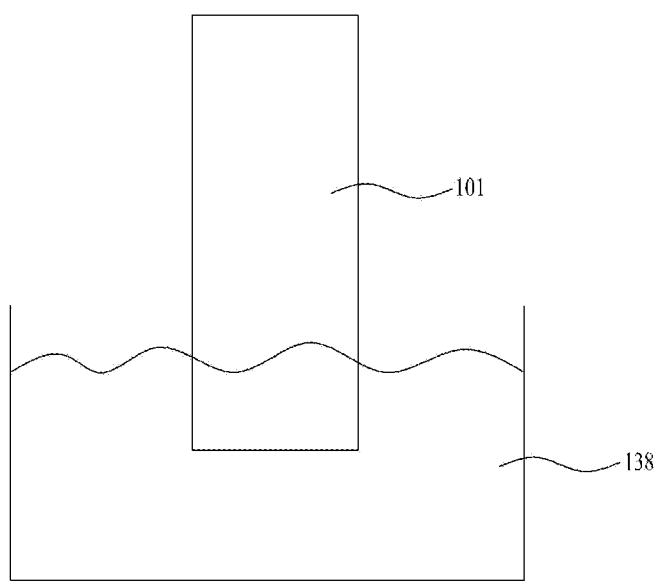
Figure 12C:
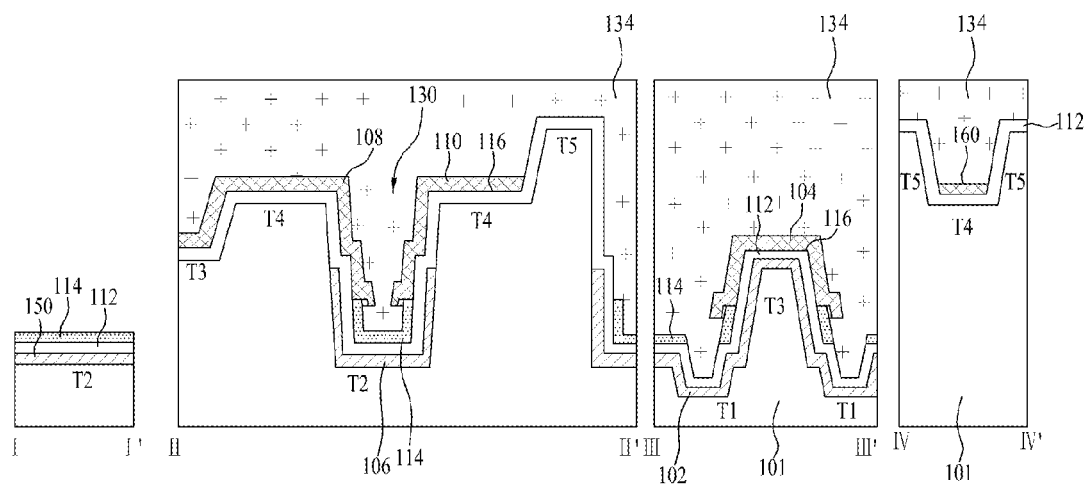
Figure 12D:
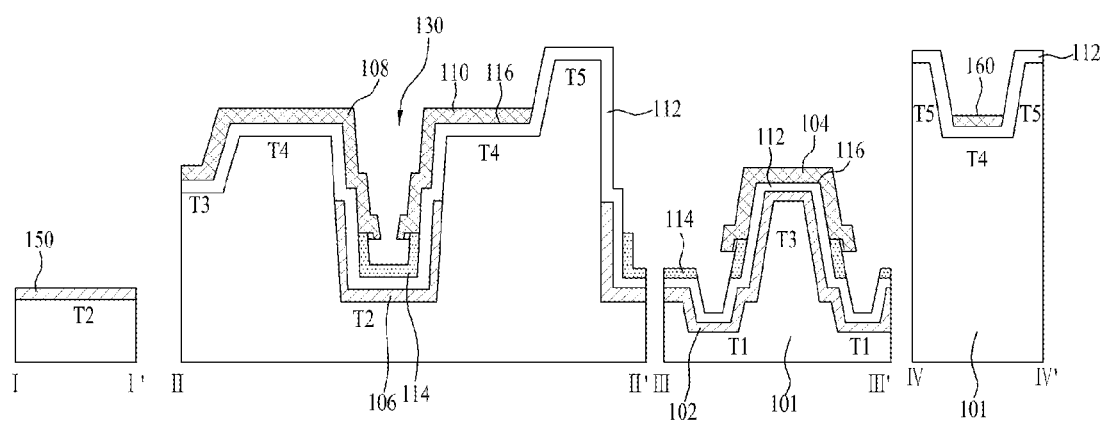

As shown in FIGS. 11A and 11B, the gate insulator layer 112 and the active layer 114 on the gate pad 150 are removed to expose the gate pad 150. Specifically, as shown in FIG. 12A, a fifth etch resist 136 is formed on a front surface of the substrate 101 having the second conductor pattern group formed thereon. The fifth etch resist 136 is formed of acrylic resin or novolac resin having tolerance to the etchant of the gate insulator layer 112 and the active layer 114. after that, a predetermined area formed on the substrate corresponding to the gate pad 150 is selectively dipped in a bath receiving strip liquid and the fifth etch resist 136 of the area corresponding to the gate pad 150 is selectively removed. As a result, the fifth etch resist pattern 134 to expose the area corresponding to the gate pad 150 is formed as shown in FIG. 12c. The exposed active layer and gate insulator layer 112 are etched by using the fifth etch resist pattern 134 as mask. After that, the active layer 114 and the gate insulator layer 112 formed on the gate pad 150 are removed and the gate pad 150 is exposed outside as shown in FIG. 12d. Also, the gate insulator layer 112 located between the gate pads 150 is removed and the fifth horizontal surface T5 of the substrate 101 is exposed.

Figure 13:
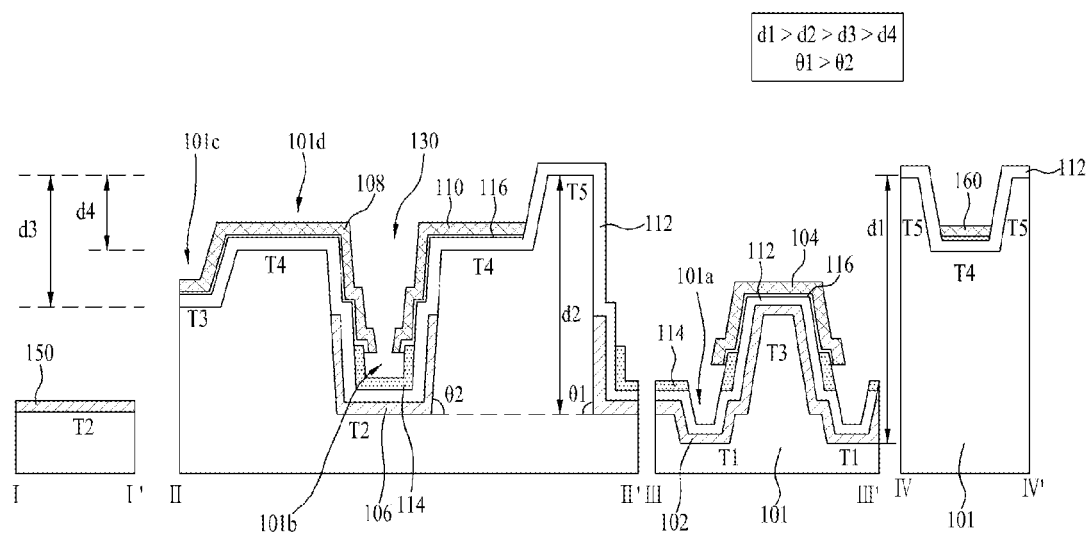
FIG. 13 is a sectional view illustrating a thin film transistor substrate according to another embodiment of the present invention.

FIG. 13 is a sectional view of a thin film transistor substrate according to another embodiment (second embodiment) of the present invention.

Compared with the thin film transistor substrate shown in FIG. 2, a thin film transistor substrate shown in FIG. 13 includes the same elements except an ohmic contact layer formed under a second conductor pattern group in the same pattern. Because of that, description of the same elements will be omitted.

The ohmic contact layer 116 is formed on the active layer 114 except a channel area to ohmic-contact with the source electrode 108 and the drain electrode 110. Such the ohmic contact layer 116 is formed under the source and drain electrode 108 and 110 and the data line and pad 104 and 160, with the same pattern as they have. In other words, the ohmic contact layer 116 is formed together with the third conductor pattern group including the source electrode 108, the drain electrode 110, the data line 104 and the data pad 160 simultaneously.

Figure 14A:
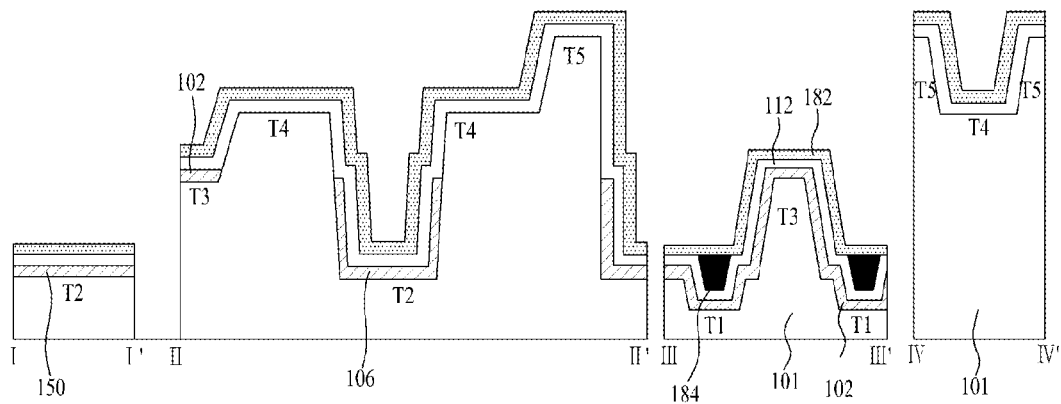
FIGS. 14A to 14I are sectional views to illustrate a method for fabricating the thin film transistor substrate shown in FIG. 13.
Figure 14B:
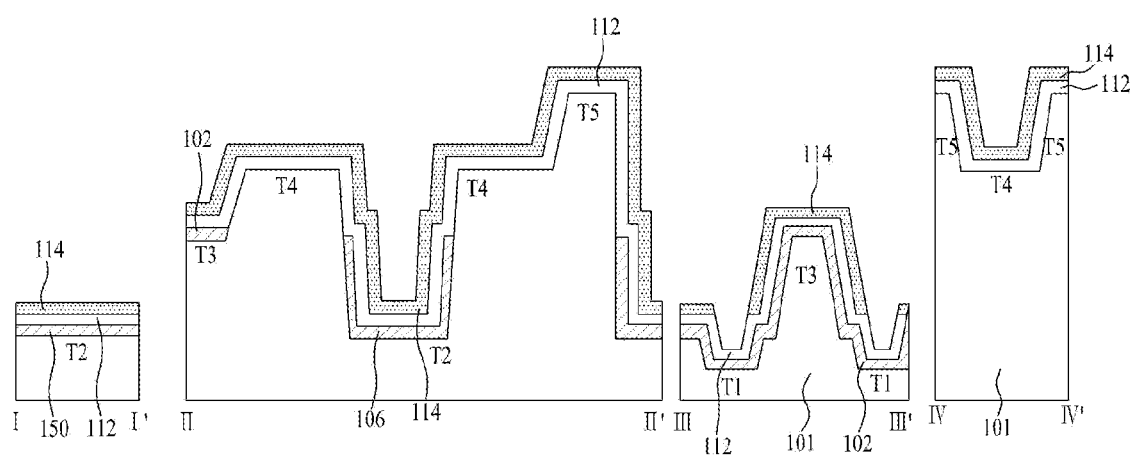
Figure 14C:
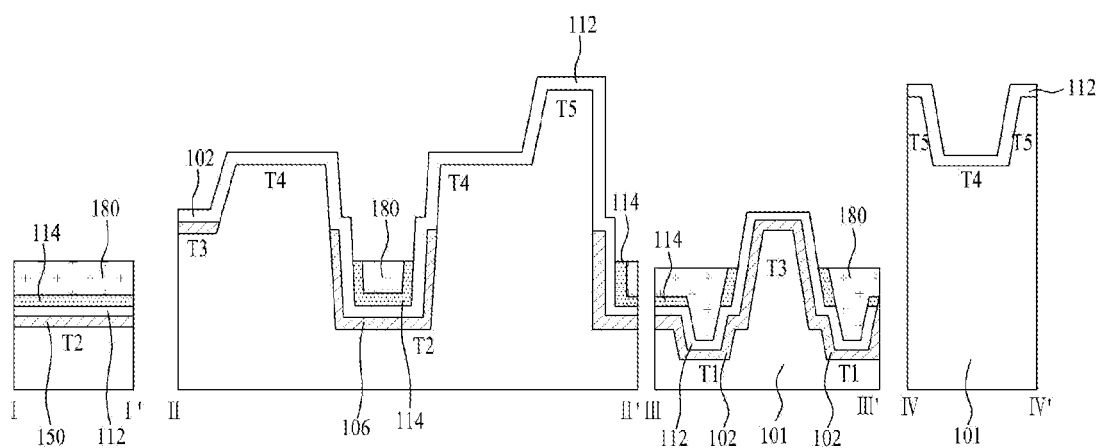
Figure 14D:
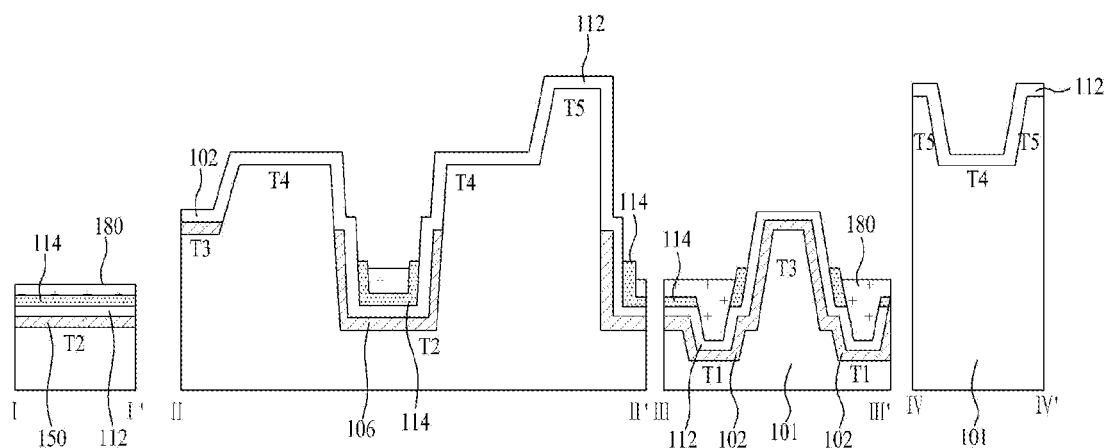
Figure 14E:
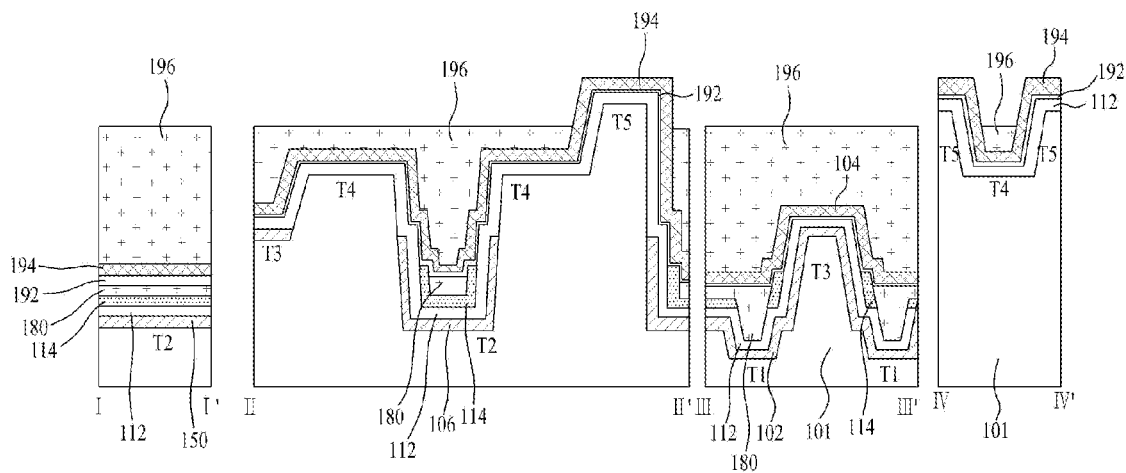
Figure 14F:
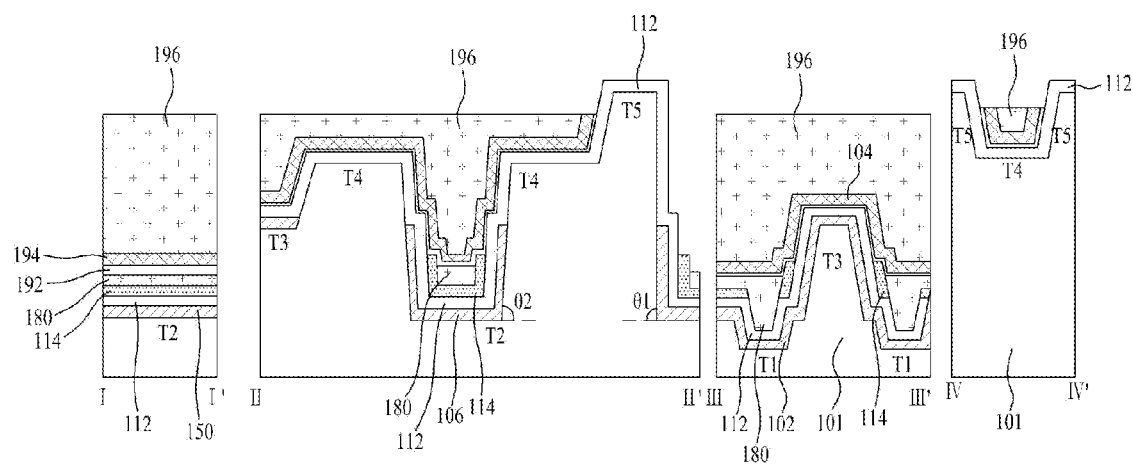
Figure 14G:
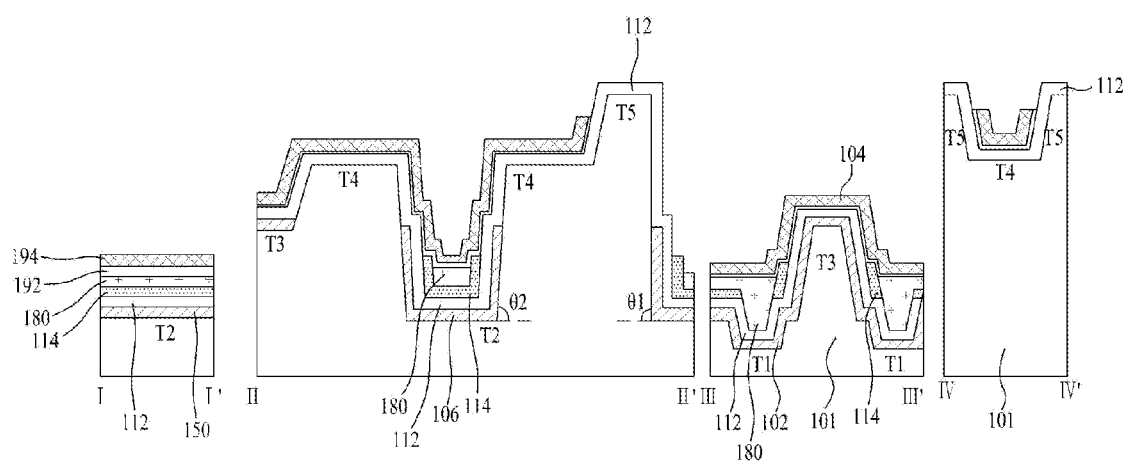
Figure 14H:
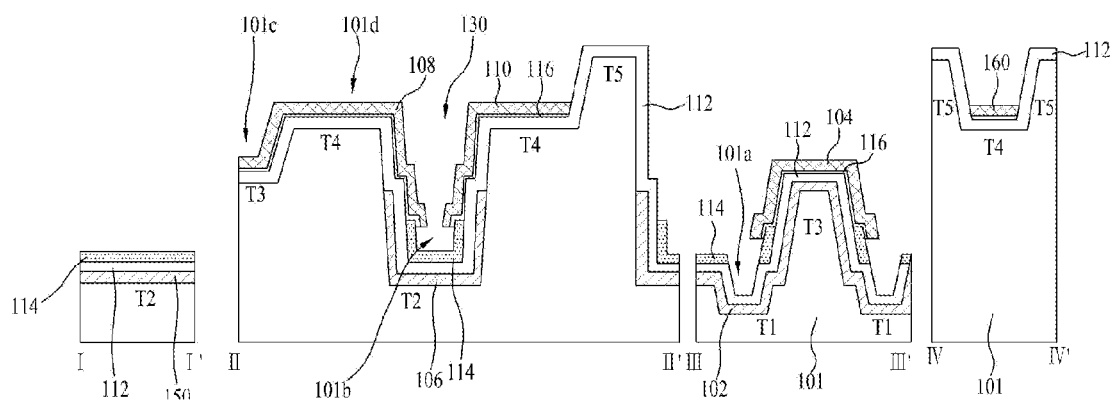
Figure 14I:
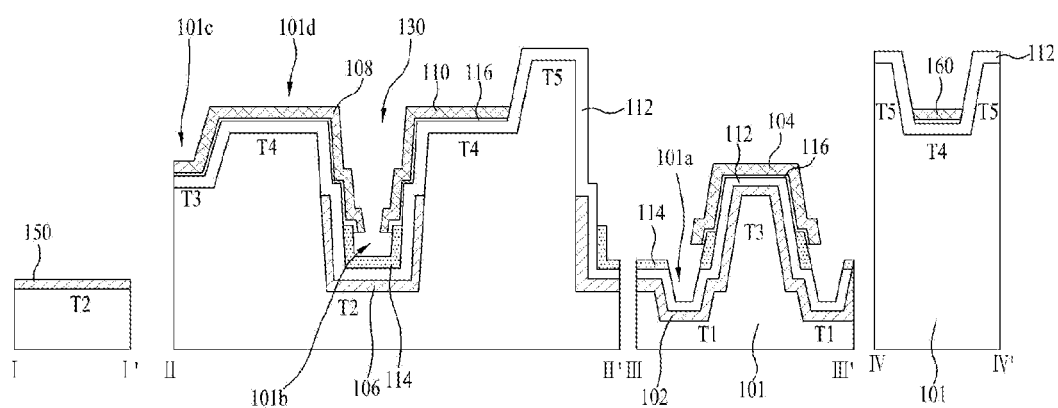

FIGS. 14a and 14i are sectional views to explain a method for fabricating the thin film transistor substrate shown in FIG. 13.

First of all, a substrate having a multi-step structure is provided according to the fabricating method shown in FIGS. 4A to 4C. After that, the first conductor pattern group is formed according to the fabricating method shown in FIGS. 6A to 6C. After that, as shown in FIG. 14A, the gate insulator layer 112 and the second etch resist are sequentially layered on a front surface of the substrate 101 having the first conductor pattern group formed thereon. The second etch resist is ashed and the second etch resist pattern 184 is formed. Then, the amorphous silicon layer 182 is layered on the substrate 101 having such the second etch resist pattern 184 formed thereon. The second etch resist pattern 184 and the amorphous silicon layer 182 on the second etch resist pattern are removed together. As a result, the amorphous silicon layer 182 formed on the gate insulator layer 112 located on the first horizontal surface T1 of the substrate is patterned to be removed as shown in FIG. 14B, and then the active layer 114 is formed. After that, as shown in FIG. 14C, the third etch resist is layered and ashed on the substrate 101 having the active layer 114 formed thereon, and then the third etch resist pattern 180 is formed. The active layer 114 is etched by using the third etch resist pattern 180 as mask. Then, after the third etch resist pattern 180 remaining on the active layer 114 shown in FIG. 14D is ashed, the amorphous silicon layer 192 having the impurity (n+ or p+) doped thereon or intrinsic, the source/drain metal layer 194 and the fourth etch resist are sequentially formed on the front surface of the substrate 101 having the ashed third etch resist pattern 180 formed thereon, as shown in FIG. 14E. After that, the fourth etch resist is ashed and the fourth etch resist pattern 196 is formed. The source/drain metal layer 194 and the amorphous silicon layer 192 having the impurity doped thereon are sequentially etched by using the fourth etch resist pattern 196 as mask, and then the second conductor pattern group including the source and drain electrodes 108 and 110, the data line 104 and the data pad 160, which are connected with each other, and the ohmic contact layer 116 located under the second conductor pattern group may be formed as shown in FIG. 14F. After that, as shown in FIG. 14G, the fourth etch resist pattern 196 remaining on the second conductor pattern group is removed in the strip process. Then, the third etch resist pattern 180, the ohmic contact layer located on the third etch resist pattern 180 and the source and drain electrodes are removed together in the lift-off process. As shown in FIG. 14H, the source and drain electrodes 108 and 110 are separated. At this time, the ohmic contact layer 116 located between the source and drain electrodes 108 and 110 is removed to expose the active layer 114. After that, the ohmic contact layer 116 is removed in a fabricating process shown in FIGS. 12A and 12D.

Figure 15:
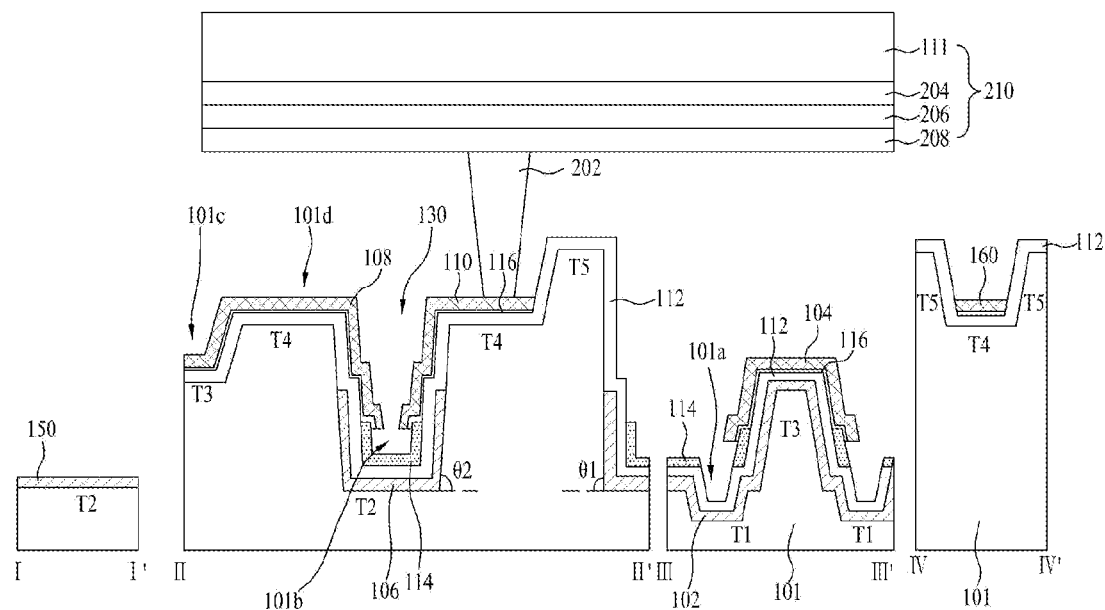
FIG. 15 is a sectional view illustrating a flat display device having the thin film transistor substrate applied thereto.

FIG. 15 is a sectional view illustrating an organic electro luminescent display device the thin film transistor substrate is applied to according to the present invention.

The organic electro luminescent display device shown in FIG. 15 includes the thin film transistor substrate according to the present invention, a luminescent substrate 210 and a contact spacer 202 to connect the others with each other.

The luminescent substrate 210 includes first electrodes 204, an organic electro luminescent layer 206 and second electrodes 208, which are formed on a second substrate 111 sequentially.

The first electrode is formed of transparent conductive material on the second substrate 111 made of transparent plastic material.

To form the organic electro luminescent layer 206, an electron injection layer (EIL), an electron transport layer (ETL), a light emitting layer, a hole transport layer (HTL) and a hole injection layer (HIL) are multi-layered sequentially. the light emitting layer 206 full-emits a light having a specific wave toward the second substrate 111, with an exciter, generated when the electron of the first electrode 204 is re-bonded with the hole of the second electrode 208, returning to a bottom state.

The second electrodes 208 are opposed to the first electrodes 204, with the organic electro luminescent layer 206 located between them. Such the second electrode made of opaque conductive material.

The contact spacer 202 electrically joins the second electrodes 208 of the luminescent substrate 210 with the drain electrodes 110 of the thin film transistor substrate. That is, a driving signal is supplied to the second electrodes 208 from the data line 104 via the contact spacer 202. The plurality of such the contact spacers 202 are formed between the drain electrodes and the second electrodes 208.

In the meanwhile, the drain electrodes 110 is employed as second electrodes 208 without the contact spacer 202 and the luminescent layer 206 and the first electrodes 204 are multi-layered on the drain electrodes 110 sequentially. In this case, the drain electrodes 110 are employed as second electrodes 208 without the contact spacer 202. Because of that, increase of an overall thickness and weight generated by the height of the contact spacer 202 may be prevented, to allow the display device to be compact and thin.

Also, it is embodied that the thin film transistor substrate according to the present invention is applied to the organic electro luminescent display device. Rather than that, the thin film transistor substrate according to the present invention may be applied to an electronic ink type display device and a reflection type liquid display device. That is, if it is applied to the electronic ink type display device, the thin film transistor substrate according to the present invention is joined with an electronic ink film via the contact spacer 202 or the drain electrodes 110 is employed as driving electrode of the electronic ink type display device.

If the thin film transistor substrate according to the present invention is applied to the reflection type display device, the drain electrodes 110 formed in the pixel areas provided in the cross portions of the gate lines 102 and the data lines are used as reflection electrodes to drive the liquid.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:

1. A method for fabricating a thin film transistor substrate comprising steps of:
   forming a substrate comprising a plurality of grooves having different depths, respectively, to have a multi-step structure, wherein the substrate comprises first to fourth grooves having different heights, respectively, and a first horizontal surface of the substrate is exposed by the first groove and a second horizontal surface of the substrate is exposed by the second groove having a lower depth than the first groove and a third horizontal surface of the substrate is exposed by the third groove having a lower depth than the second groove and a fourth horizontal surface of the substrate is exposed by the fourth groove having a lower depth than the third groove; and
   forming gate and data lines, alternatively crossed to form a plurality of pixel areas, and thin film transistors, formed in cross portions of the gate and data lines, in the grooves of the substrate;
   wherein active layers of the thin transistor are formed along the gate lines and gate electrodes, the active layers separated from active layers of neighboring pixel areas having the data line located therebetween;

wherein the step of forming the gate and data lines and the thin film transistors in the grooves of the substrate comprises steps of:

forming the gate lines and gate electrodes of the thin film transistors on the first and second horizontal surfaces and on side surfaces located between each two of the first to third horizontal surfaces, using first etch resist patterns;

forming a gate insulator layer on a front surface of the substrate;

forming the active layers on the second horizontal surface of the substrate and on the gate insulator layer corresponding to a side surface located between the second and third horizontal surfaces, the active layers overlapped with the gate electrodes with the gate insulator layer located there between to form channels between the source and drain electrodes; and forming source electrodes, drain electrodes and data lines on the third and fourth horizontal surfaces of the substrate and one side surfaces located between each two of the second to fourth horizontal surfaces; and wherein the step of forming the active layers comprises steps of:

forming a second etch resist pattern on the first horizontal surface of the substrate having the gate insulator layer formed thereon;

forming first and second silicon layers on the substrate having the second etch resist pattern formed thereon;

removing the second etch resist pattern, the first and second silicon layers on the second etch resist pattern in a lift-off process;

forming a third etch resist pattern to cover the first and second horizontal surfaces and the side surface located between each two of the first to third horizontal surfaces; and forming the active layers and an ohmic contact layer on the active layers by etching the first and second silicon layers, using the third etch resist pattern as mask.

2. The method substrate of claim 1, wherein the step of forming the substrate comprises steps of:

forming an imprint-mold comprising first to fourth projections corresponding to the first to fourth grooves;

forming the substrate having the first to fourth grooves by pressing a plastic film, using the imprint-mold; and separating the imprint-mold from the substrate.

3. The method of claim 1, wherein the step of forming the gate lines and the gate electrodes of the thin transistors comprises steps of:

forming a gate metal layer on a front surface of the substrate;

forming the first etch resist patterns on the first to third horizontal surfaces and on side surfaces located each two of the first to third horizontal surfaces;

etching the gate metal layer by using the first etch resist patterns as mask; and removing the first etch resist patterns.

4. The method of claim 1, wherein the step of forming the data lines, the source electrodes and the drain electrodes comprises steps of:

ashing the third etch resist pattern to expose an end of the ohmic contact layer partially;

forming a source/drain metal layer on the substrate to cover the asked third etch resist pattern;

forming a fourth etch resist pattern on the first to fourth horizontal surfaces on the source/drain metal layer;

etching the source/drain metal layer, using the fourth etch resist pattern as mask;

removing the fourth etch resist pattern; and removing the third etch resist pattern and the source/drain metal layer on the third etch resist pattern in a lift-off process.

5. The method of claim 1, wherein the step of forming the active layers comprises steps of:

forming a second etch resist pattern on the first horizontal surface of the substrate having the gate insulator layer formed thereon;

forming a first silicon layer on the substrate having the second etch resist pattern formed thereon;

removing the second etch resist pattern and the first silicon layer on the second etch resist pattern in a lift-off process;

forming a third etch resist pattern to cover the first and second horizontal surfaces and side surfaces located each two of the first to third horizontal surfaces; and forming the active layers by etching the first silicon layer, using the third etch resist pattern as mask.

6. The method of claim 5, wherein the step of forming the data lines, the source electrodes and the drain electrodes comprises steps of:

asking the third etch resist pattern to expose an end of the active layer partially;

forming a second silicon layer and a source/drain metal layer on the substrate to cover the asked third etch resist pattern;

forming a fourth etch resist pattern on the first to fourth horizontal surfaces formed on the source/drain metal layer;

forming an ohmic contact layer together with the data lines and the source and drain electrodes by sequentially etching the source/drain metal layer and the second silicon layer, using the fourth etch resist pattern as mask;

removing the fourth etch resist pattern; and separating the source and drain electrodes and the ohmic contact layer located between the source and drain electrodes by removing the third etch resist pattern in a lift-off process.

7. The method of claim 1 or 5, wherein the second etch resist pattern is level with respect to the gate insulator formed on the second horizontal surface.

8. The method of claim 1, further comprising steps of:

forming gate pads on the second horizontal surface, together with the gate lines;

forming data pads on the fourth horizontal surface, together with the data lines; and exposing the gate pads by removing the active layer and the gate insulator layer formed on the gate pads.

9. The method of claim 8, wherein the step of exposing the gate pads comprises steps of:

coating an etch resist on the front surface of the substrate having the source electrodes, the drain electrodes, the data lines and the data pads formed thereon;

forming a fifth etch resist pattern by patterning the etch resist after dipping a predetermined portion of the substrate having the gate pads formed thereon; and etching the active layer and the gate insulator layer, using the fifth etch resist pattern as mask.

10. The method of claim 1, wherein the active layers are separated from active layers of the neighboring pixel areas with respect to the first groove located in both sides of the data line.

11. The method of claim 1, wherein the gate lines and the data lines are crossed each other with the gate insulator layer on the third horizontal surface.

12. The method of claim 1, wherein a taper angle of a side surface located between the fourth horizontal surface having the source and drain electrodes formed thereon and second horizontal surface having the gate electrodes formed thereon is smaller than a taper angle of a side surface located between the second horizontal surface having the gate electrodes and gate lines formed thereon and a fifth horizontal surface adjacent to the second horizontal surface.

* * * * *